(12) United States Patent
Wang

(10) Patent No.: US 7,795,096 B2
(45) Date of Patent: Sep. 14, 2010

(54) METHOD OF FORMING AN INTEGRATED CIRCUIT WITH TWO TYPES OF TRANSISTORS

(75) Inventor: Peng-Fei Wang, Dresden (DE)

(73) Assignee: Qimonda AG, Munich (DE)

( * ) Notice: Subject to any disclaimer, the term of this patent is extended or adjusted under 35 U.S.C. 154(b) by 712 days.

(21) Appl. No.: 11/647,602

(22) Filed: Dec. 29, 2006

(65) Prior Publication Data
US 2008/0157211 A1 Jul. 3, 2008

(51) Int. Cl.
*H01L 21/336* (2006.01)
(52) U.S. Cl. .................. 438/270; 257/E21.583
(58) Field of Classification Search .......... 438/270; 257/E21.583
See application file for complete search history.

(56) References Cited

U.S. PATENT DOCUMENTS 7,132,333 B2 * 11/2006 Schloesser et al. .......... 438/272

| 2004/0266118 A1 | 12/2004 | Han et al. |
| 2005/0239254 A1 | 10/2005 | Chi et al. |
| 2007/0176253 A1 | 8/2007 | Wang et al. |

OTHER PUBLICATIONS

M. Yoshida et al., "A Full FinFET DRAM Core Integration Technology Using a Sample Selective Fin Formation Technique," 2006 Symposium VLSI Technology Digest of Technical Papers.

* cited by examiner

*Primary Examiner*—Thao X Le
*Assistant Examiner*—Elias Ullah
(74) *Attorney, Agent, or Firm*—Edell, Shapiro & Finnan, LLC

(57) ABSTRACT

An integrated circuit includes a transistor of a first type with a first gate electrode and a transistor of a second type with a second gate electrode. The first gate electrode is formed in a first gate groove that is defined in a semiconductor substrate, and the second gate electrode is formed in a second gate groove defined in the semiconductor substrate. The first gate electrode completely fills a space between two adjacent first isolation trenches, and the second gate electrode partially fills a space between two adjacent second isolation trenches, with substrate portions being arranged between the second gate electrode and the adjacent second isolation trenches, respectively.

12 Claims, 30 Drawing Sheets

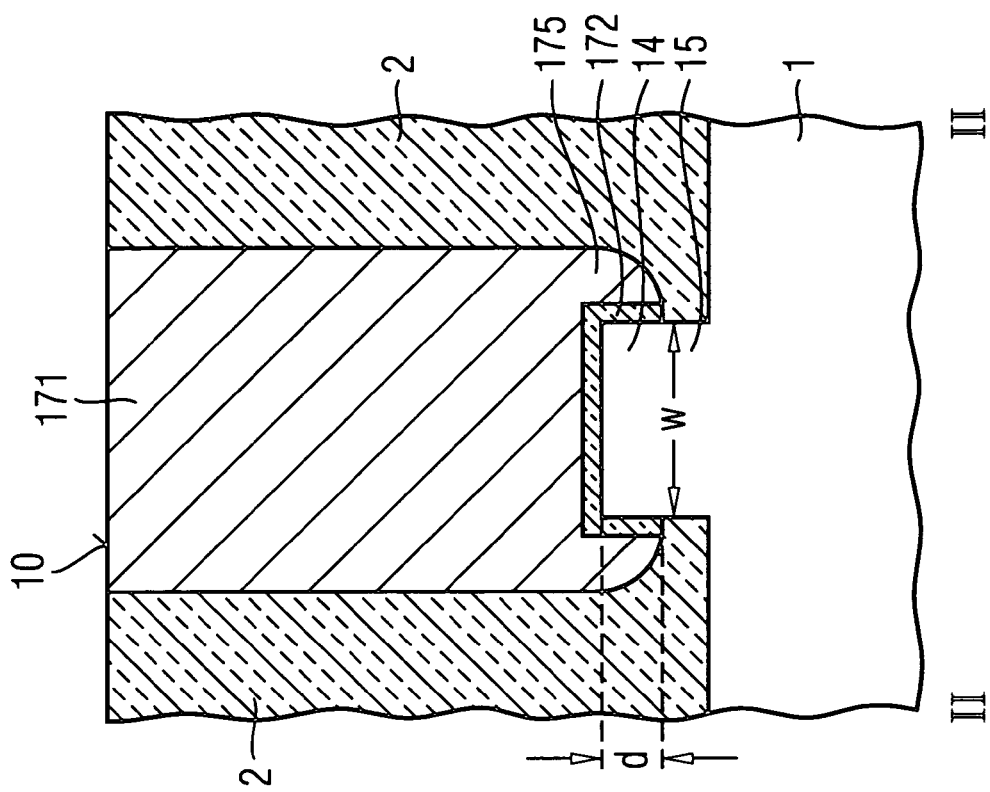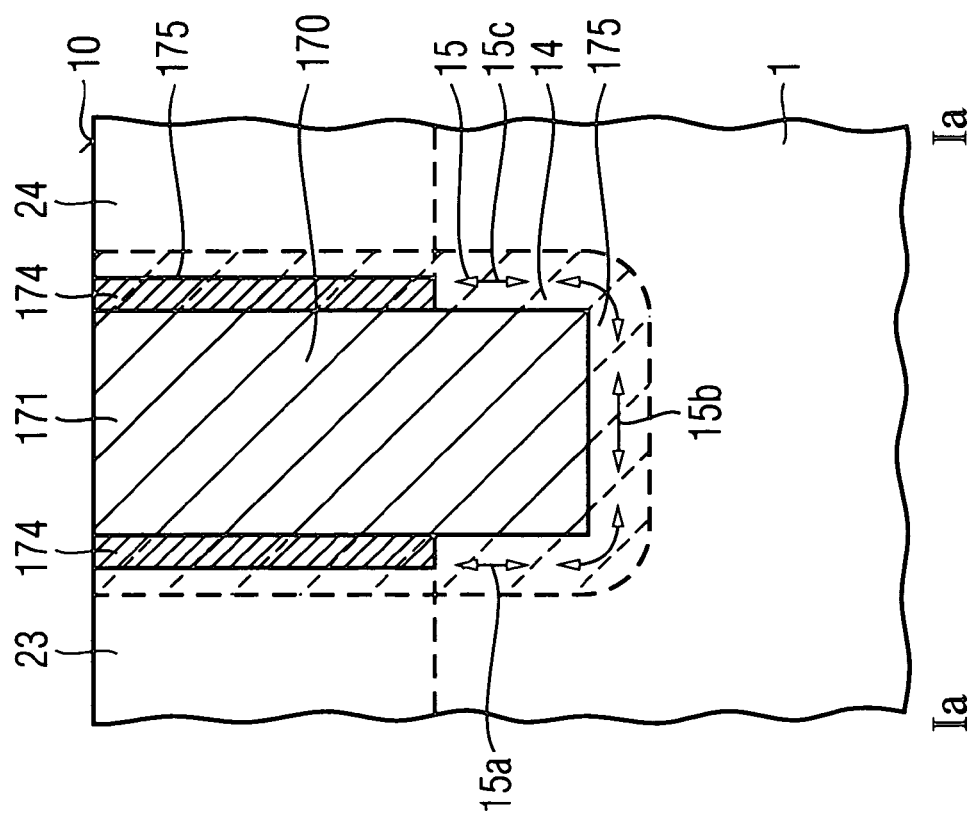

FIG 4A
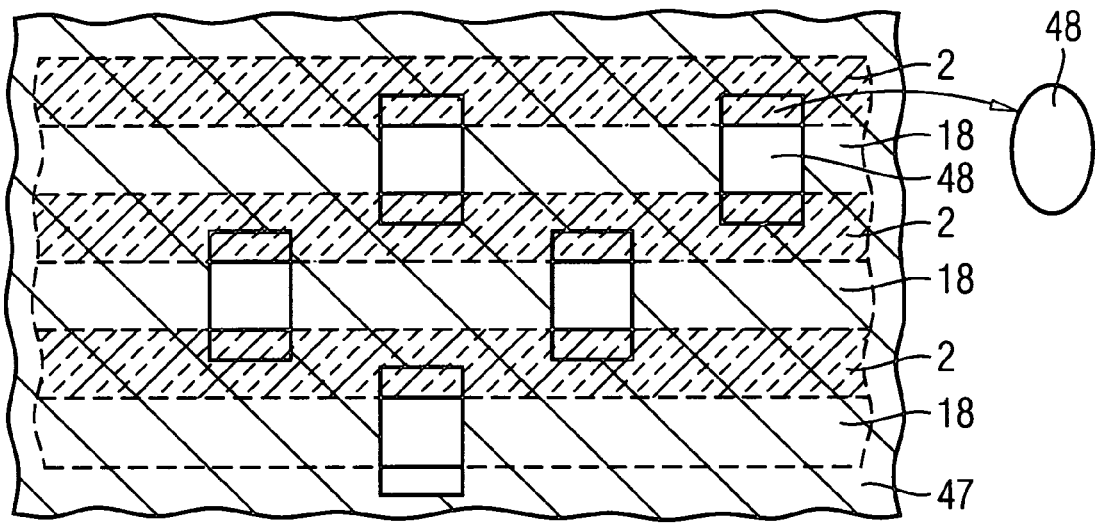
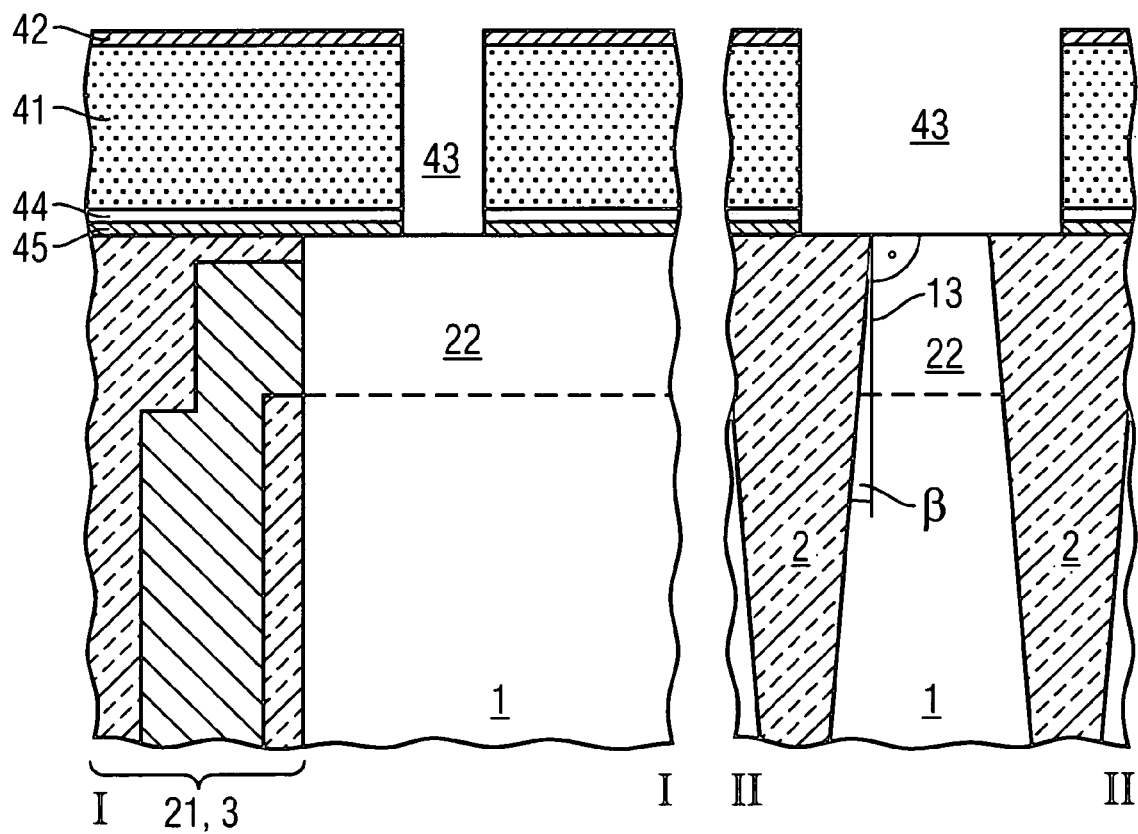

FIG 4B
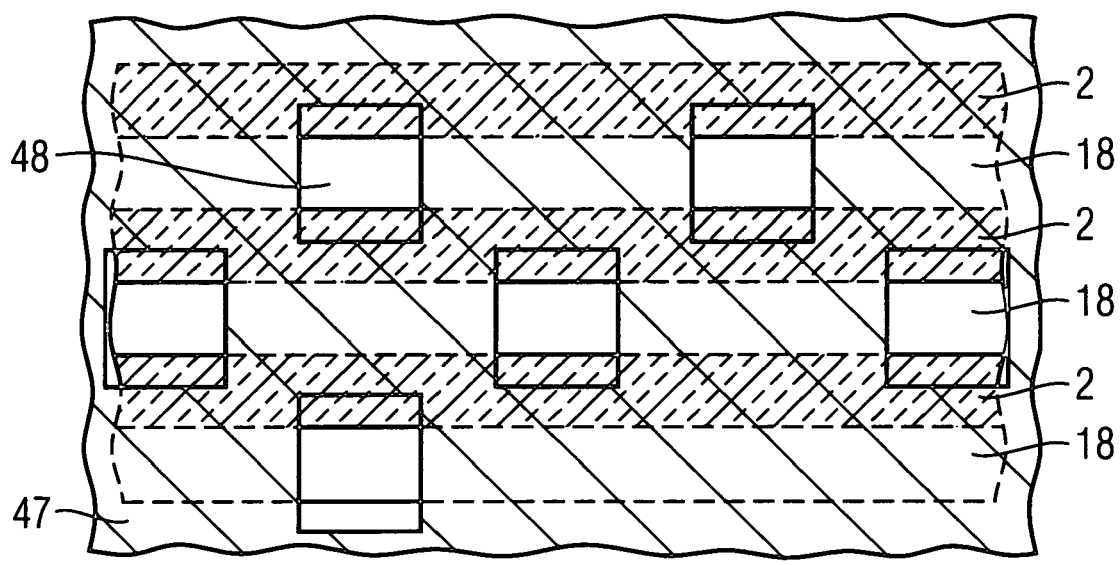
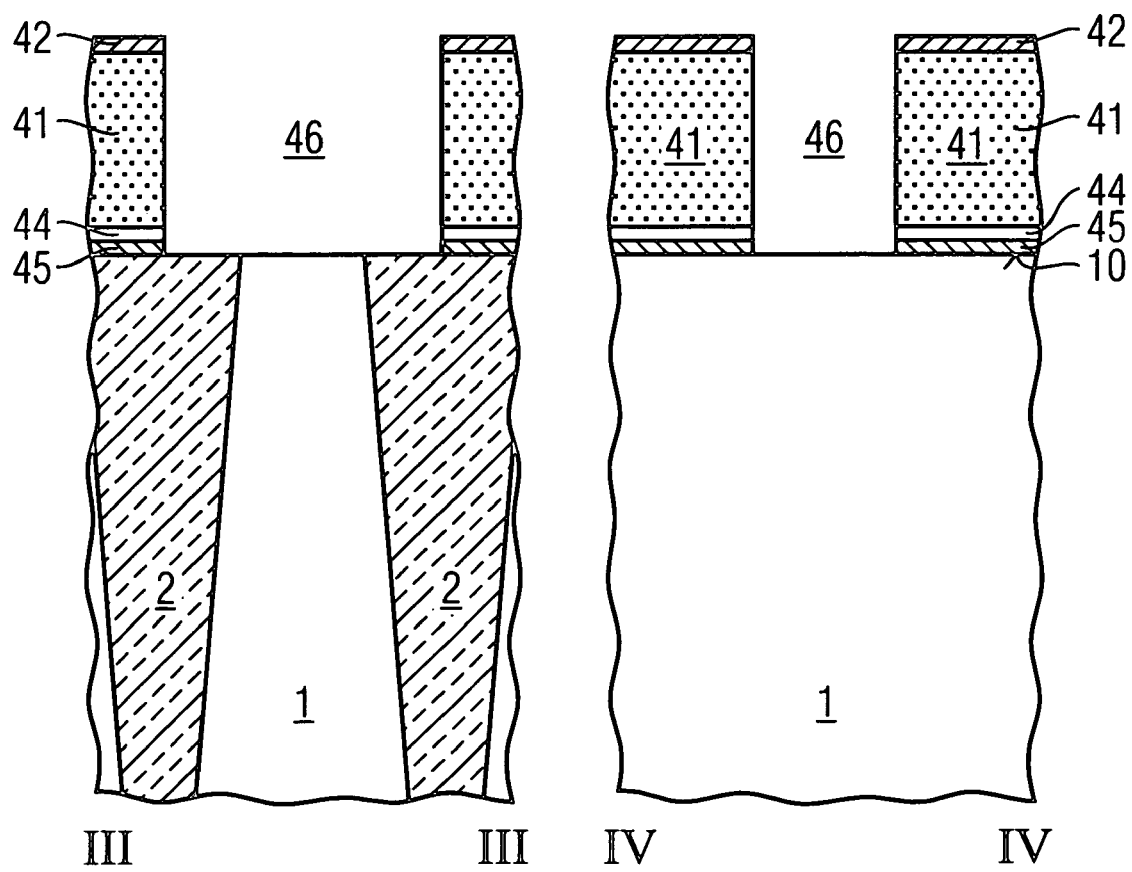

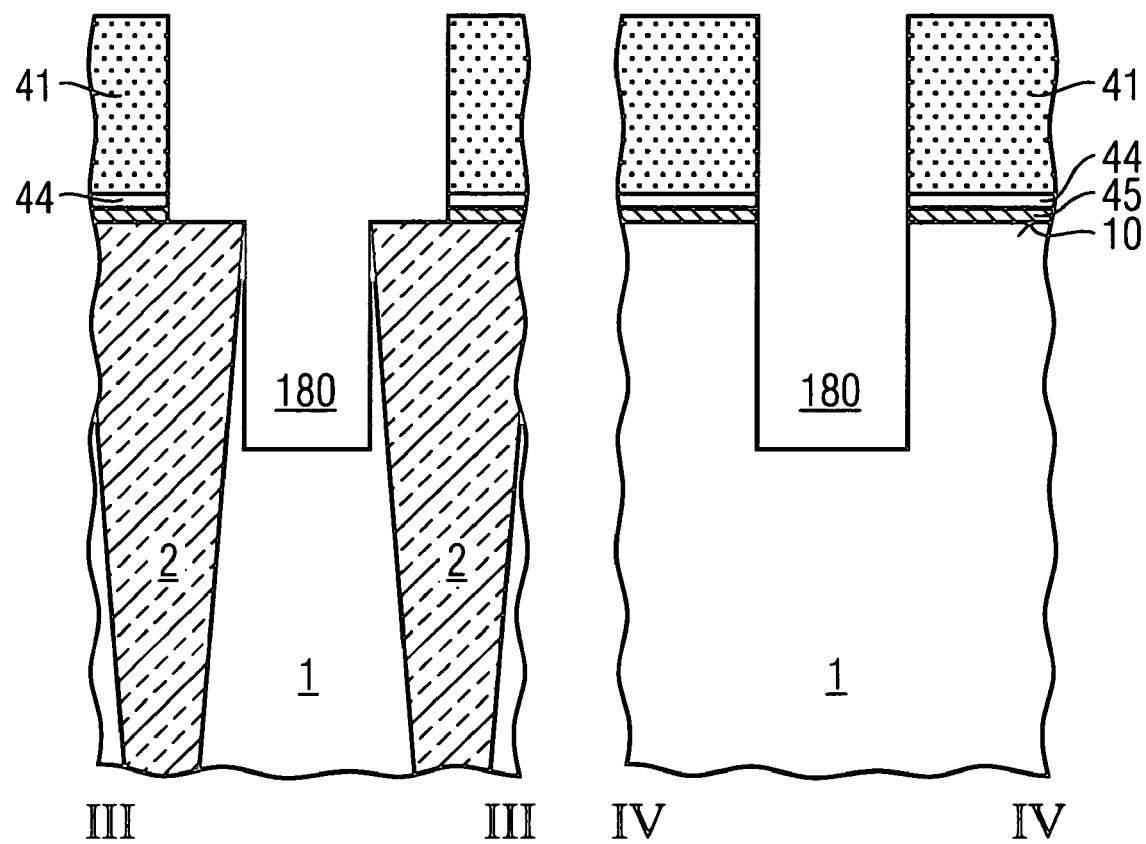

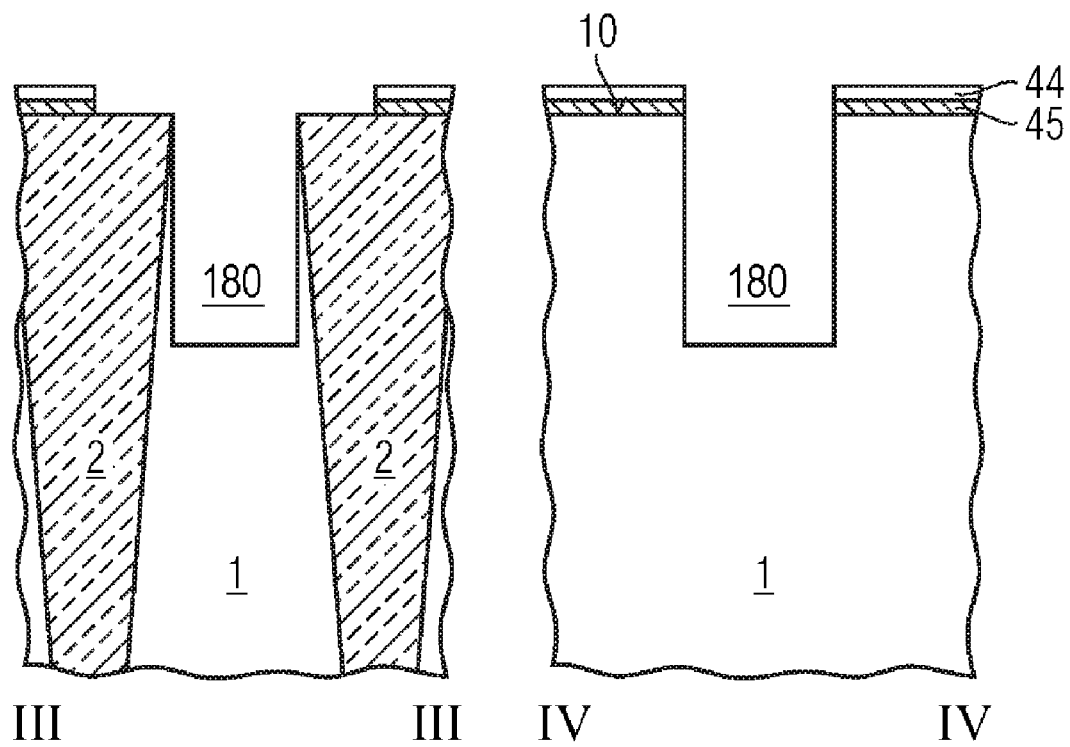

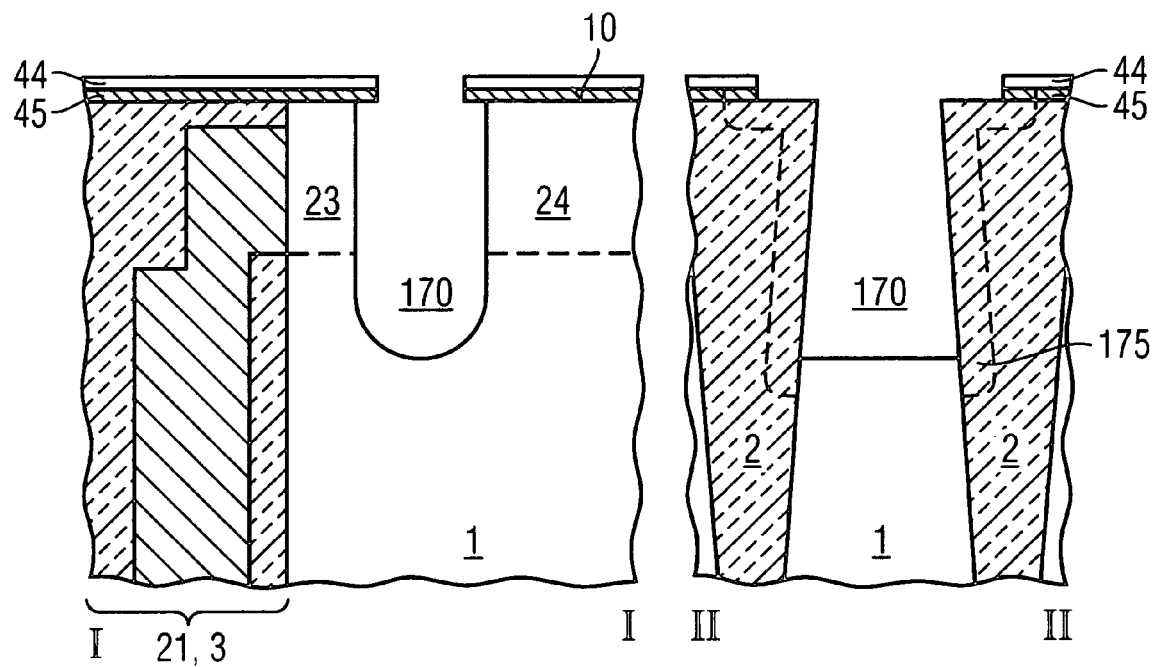

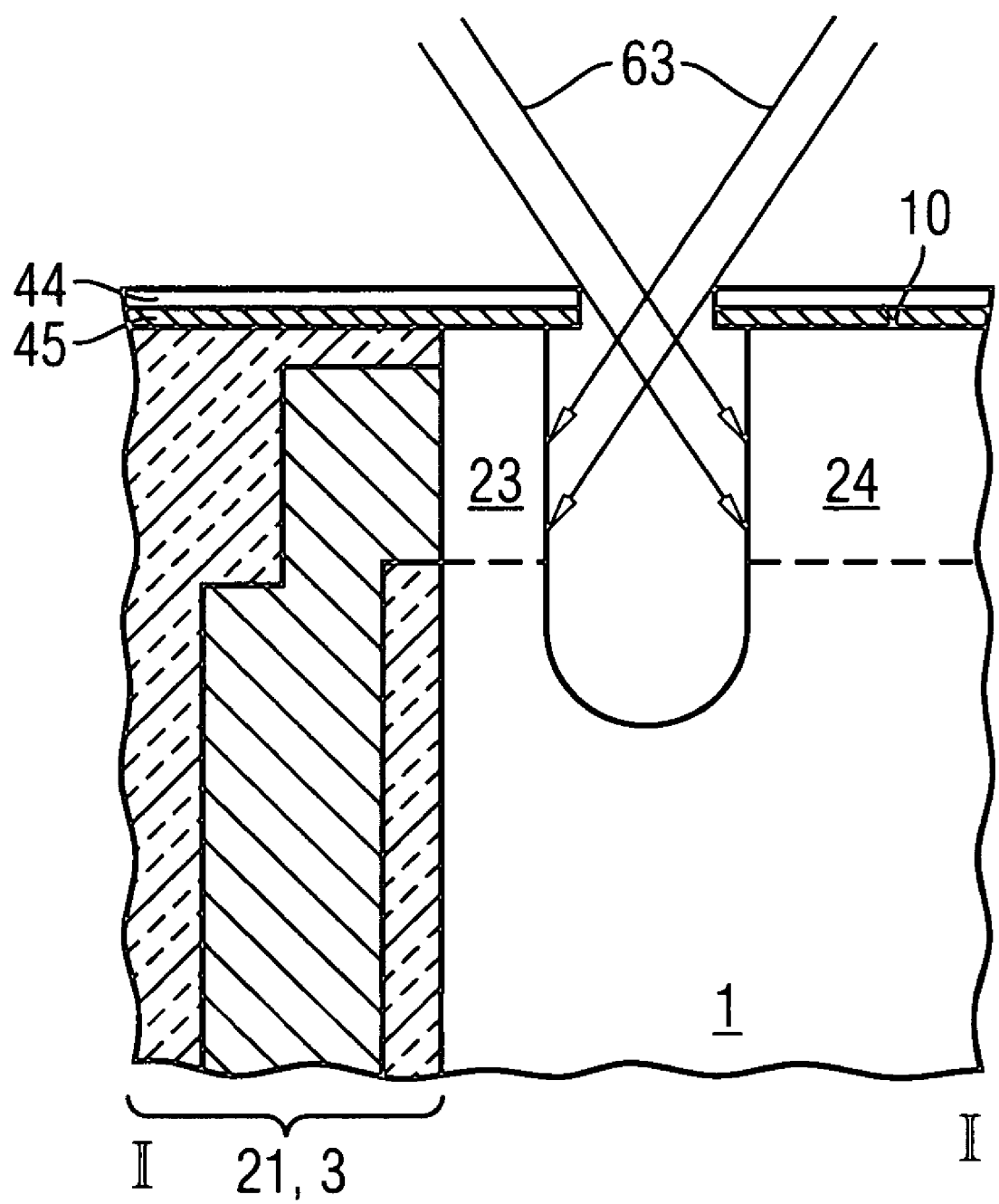

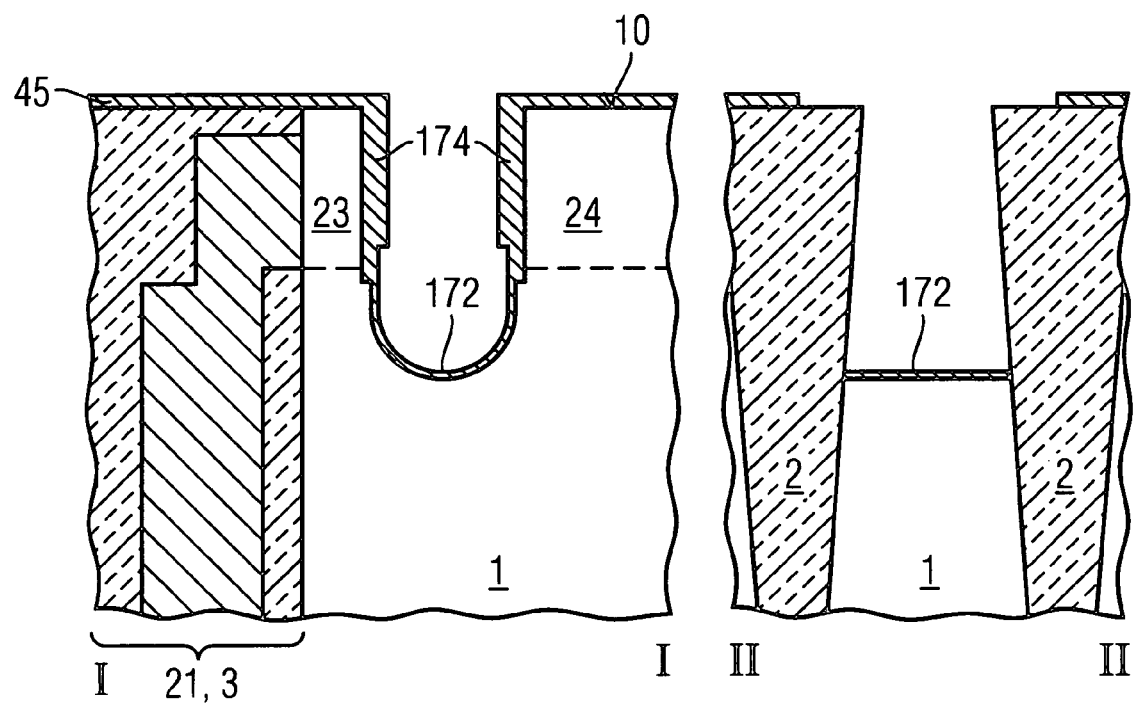

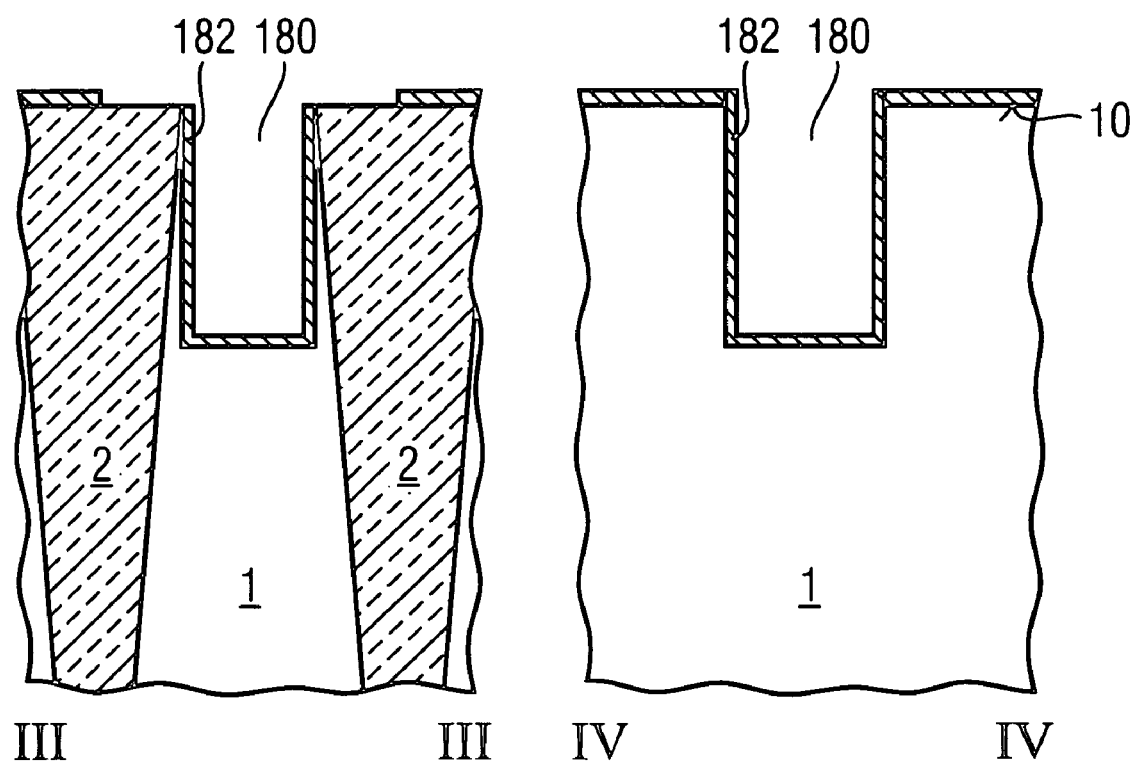

US 7,795,096 B2

METHOD OF FORMING AN INTEGRATED CIRCUIT WITH TWO TYPES OF TRANSISTORS

BACKGROUND

Generally, in the field of semiconductor technologies, many kinds of transistors having different characteristics such as threshold voltage (Vth), speed and power consumption are known. Depending on the field of application, a transistor type having a high or a low threshold voltage is desired. Moreover, there are several concepts for increasing the channel length of a transistor. In a similar manner, an appropriate transistor type can be selected depending on the desired application.

In addition, it is often desired to combine two transistors having different characteristics on one single chip. In this case, a method might be useful by which transistors having different characteristics can be manufactured in the same semiconductor substrate.

SUMMARY

The present specification relates to an integrated circuit as well as to a method of manufacturing such an integrated circuit. Moreover, the specification refers to a memory device as well as to a method of manufacturing such a memory device. The integrated circuit comprises a transistor of a first type comprising a first gate electrode formed in a first gate groove that is defined in a semiconductor substrate such that the first gate electrode completely fills a space between two adjacent first isolation trenches. The integrated circuit further comprises a transistor of a second type comprising a second gate electrode formed in a second gate groove defined in the semiconductor substrate such that the second gate electrode partially fills a space between two adjacent second isolation trenches, with substrate portions being arranged between the second gate electrode and the adjacent second isolation trenches, respectively.

BRIEF DESCRIPTION OF THE DRAWINGS

The accompanying drawings are included to provide a further understanding of embodiments the present invention and are incorporated in and constitute a part of this specification. The drawings illustrate the embodiments of the present invention and together with the description serve to explain the principles of embodiments of the invention. Other embodiments of the present invention and many of the intended advantages of embodiments of the present invention will be readily appreciated as they become better understood by reference to the following detailed description. The elements of the drawings are not necessarily to scale relative to each other. Like reference numerals designate corresponding similar parts.

FIG. 1E shows another cross-sectional view of an exemplary integrated circuit along the first direction.

FIG. 1F shows a cross-sectional view of an exemplary integrated circuit along the second direction.

FIGS. 3A to 11C show exemplary cross-sectional views of an integrated circuit when performing a method according to an embodiment of the present invention after various processing steps.

DETAILED DESCRIPTION

In the following detailed description, reference is made to the accompanying drawings, which illustrate specific embodiments in which the invention may be practiced. In this regard, directional terminology such as "top", "bottom", "front", "back", "leading", "trailing", etc., is used with reference to the orientation of the figures being described. Since components of embodiments of the present invention can be positioned in a number of different orientations, the directional terminology is used for purposes of illustration and in no way limiting. It is to be understood that other embodiments may be utilized and structural or logical changes may be made without departing from the scope of the present invention. The following detailed description, therefore, is not to be taken in a limiting sense.

Figure 2A:
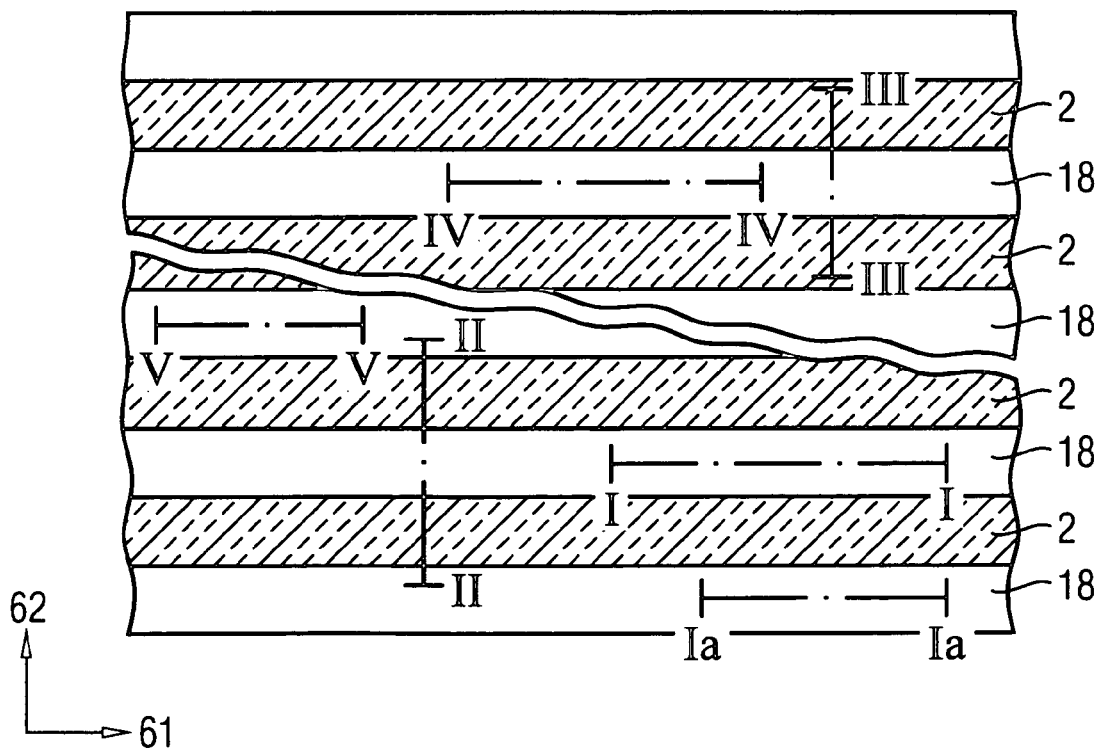
FIG. 2A shows an exemplary plan view of a semiconductor substrate.
Figure 2B:
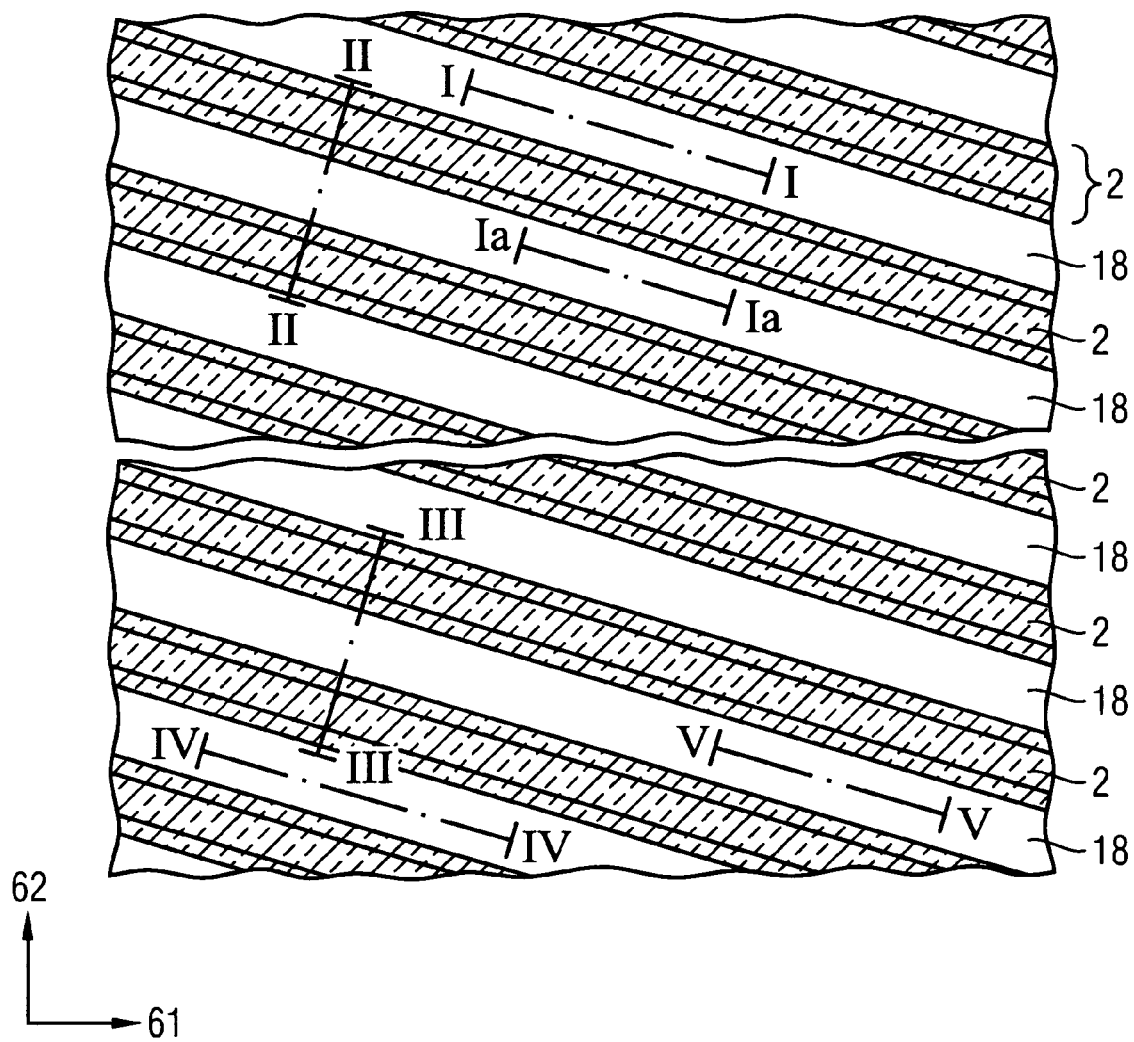
FIG. 2B shows another exemplary plan view of a semiconductor substrate.

FIG. 2A and 2B show exemplary plan views of an integrated circuit according to embodiments of the present invention. As can be seen from FIGS. 2A and 2B, active areas 18 are formed in a semiconductor substrate. For example, the active areas 18 may be defined by forming corresponding isolation trenches 2 which are filled with an insulating material. The isolation trenches 2 electrically insulate adjacent active areas 18 from each other. Although the active areas 18 are formed so as to extend as continuous lines, it is clearly to be understood that they may have any arbitrary shape. For example, the active areas may be formed as segmented active areas which are isolated from each other by appropriate isolation devices as will be explained later. As is shown, the longitudinal direction of the active areas 18 may extend in the first direction 61 or in a direction which is slanted with respect to the first direction.

As will be explained herein after, an integrated circuit or a semiconductor chip may comprise a transistor of a first type comprising a first gate electrode and a transistor of a second type comprising a second gate electrode, wherein the first gate electrode is formed in a first gate groove that is defined in a semiconductor substrate and the second gate electrode is formed in a second gate groove defined in the semiconductor substrate, wherein the first gate electrode completely fills a space between two adjacent first isolation trenches and the second gate electrode partially fills the space between two adjacent second isolation trenches, with substrate portions being arranged between the second gate electrode and the adjacent second isolation trenches, respectively.

Alternatively, an integrated circuit or a semiconductor chip may comprise a transistor of a first type comprising a first gate electrode and a transistor of a second type comprising a second gate electrode, wherein the first gate electrode is formed in a first gate groove defined in a semiconductor substrate, wherein the second channel comprises two fin-like channel portions extending between the first and the second source/drain regions of the transistor, the second gate electrode being adjacent to a side of each of the fin-like channel portions.

Figure 1A:
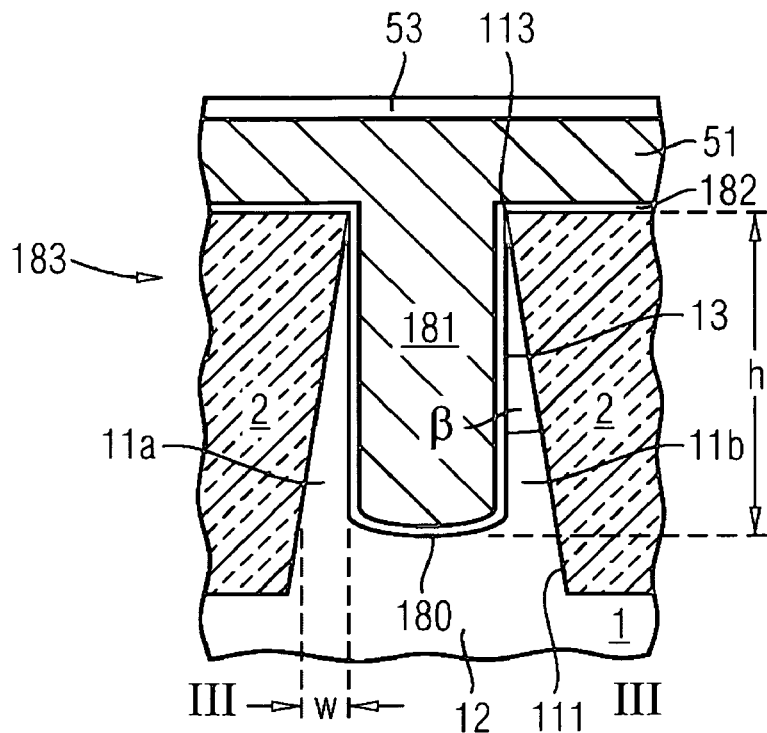
FIG. 1A shows a cross-sectional view of an exemplary integrated circuit along a first direction.

FIG. 1A shows a cross-sectional view of a transistor 183 of the second type between III and III, as can be taken from FIGS. 2A and 2B, respectively. As can be seen, in the shown cross-sectional view, the transistor 183 comprises a second gate electrode 181. The second gate electrode 181 is formed in a second gate groove 180 which is formed in the semiconductor substrate 1. The second gate groove 180 is formed between the isolation trenches 2. As shown in FIG. 1A, the second gate electrode 181 and the second gate groove 180 only partially fill the space between the two adjacent isolation trenches 2. Accordingly, substrate portions 11a, 11b are disposed between the second gate electrode 181 and the adjacent isolation trenches 2, respectively. These two substrate portions 11a, 11b form the fin-like portions of the second channel which is disposed between the first and the second source/drain-portions, as can be taken from FIG. 1C, for example. As is further shown in FIG. 1A, the sidewalls of the isolation trenches 2 do not extend perpendicularly with respect to the substrate surface 10 but are tapered. An angle β is defined between the sidewalls of the isolation trenches 2 and a normal 13 to the substrate surface. For example, β may be more than 15°. For example, β may be less than 20°. Moreover, each of the fin-like portions 11a, 11b has a width w in the bottom part thereof. The width can be larger than 5 nm, for example, larger than 10 nm. Moreover, the width w may be smaller than 20 nm. The height h of the fin-like channel portion may be equal to the height of the channel portion in which the channel is enclosed by the second gate electrode 181 on one side and by the isolation trench on the other side thereof. Accordingly, the height h of the fin-like channel portion 11a, 11b corresponds to the distance between the top side of the channel 113 and the bottom side of the gate electrode 181. The height h may be more than 30 nm, for example, more than 40 nm. The height h may be less than 50 nm.

Figure 1B:
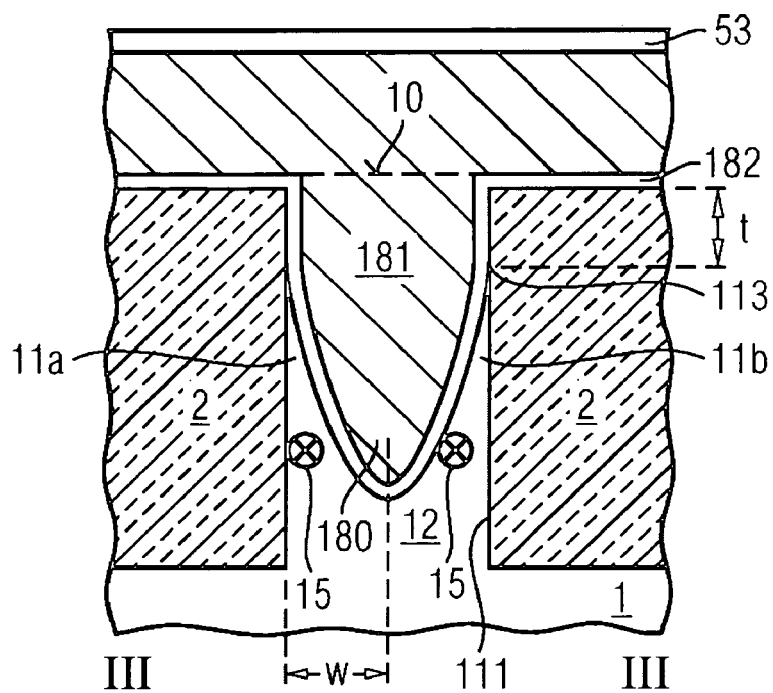
FIG. 1B shows a cross-sectional view of a further exemplary integrated circuit along the first direction.

Moreover, FIG. 1B shows another cross-sectional view between III and III according to another embodiment of the present invention. As can be seen, in contrast to the embodiment shown in FIG. 1A, the sidewalls of the isolation trenches 111 extend perpendicularly with respect to the substrate surface. Moreover, the upper surface of the substrate portion which is disposed between the second gate groove 180 and the isolation trenches 2 may be recessed. Accordingly, the surface 113 of the fin-like portions 11a, 11b may be disposed beneath the surface 10 of the substrate 1. For example, the distance t from the substrate surface 10 to the surface 113 of the fin-like portions 11a, 11b may be more than 10 nm, by way of example, more than 20 nm. The distance t may be less than 50 nm. As is further indicated in FIG. 1B, the current path 15 runs along the fin-like portions 11a, 11b.

Figure 1C:
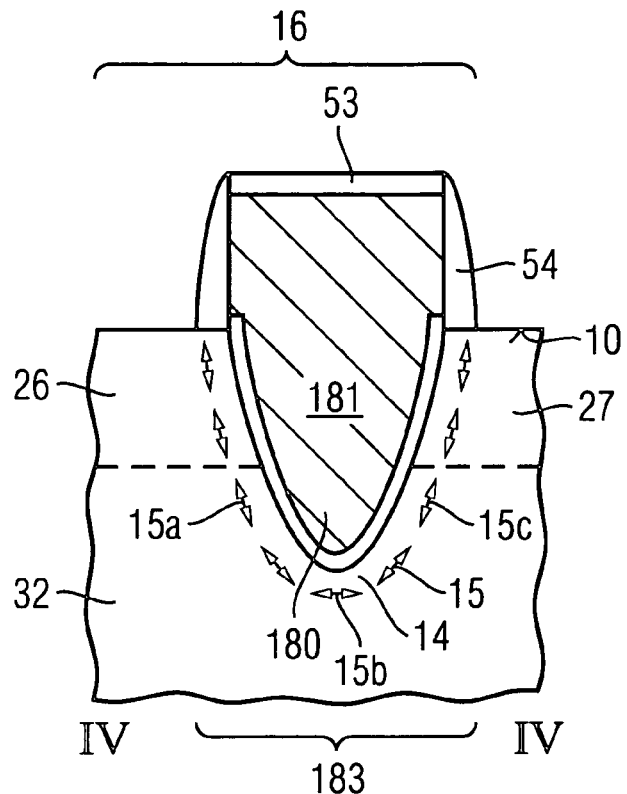
FIG. 1C shows a cross-sectional view of an exemplary integrated circuit along a second direction.

FIG. 1C shows a cross-sectional view of the transistor between IV and IV as can be taken from FIG. 2, for example.

To be more specific, the cross-sectional view of FIG. 1C is taken along an active area. As can be seen, a channel 14 is formed between first and second source/drain regions 26, 27. The second gate electrode 181 controls the conductivity of the channel 14. The second gate electrode 181 is formed in the second gate groove 180. The depth of the gate groove 180 in the cross-section showing in FIG. 1C depends on the distance from the specific cross-section to the adjacent isolation trench 2. The current path 15 between the first and the second source/drain regions 26, 27 comprises a first vertical portion 15a, a horizontal portion 15b as well as a second vertical portion 15c. The depth of the vertical portions 15a and 15c depend on the specific implementation of the fin-like portions 11a, 11b. For example, the vertical portions 15a, 15c may extend to the depth t.

Figure 1D:
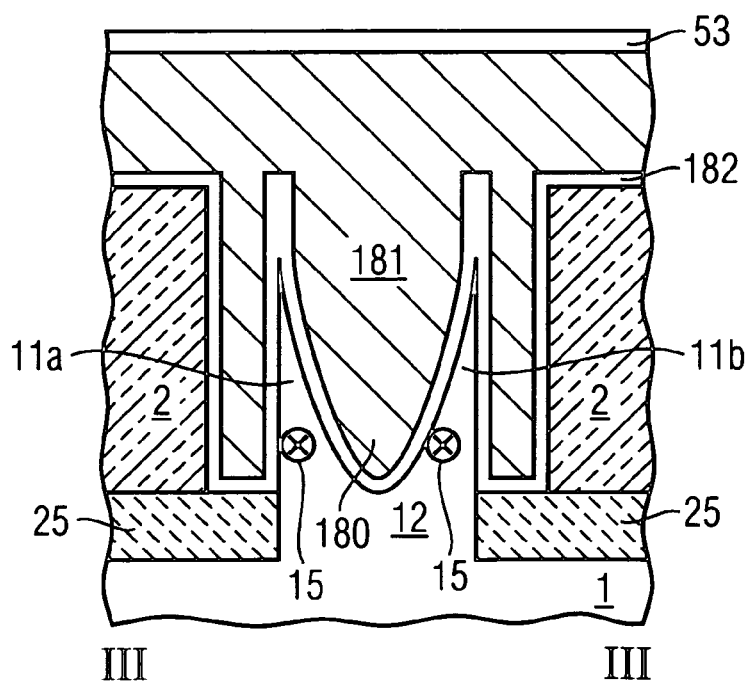
FIG. 1D shows a cross-sectional view of another exemplary integrated circuit along the first direction.

FIG. 1D shows another embodiment of the semiconductor chip, wherein the second transistor comprises a gate electrode which encloses the fin-like portions 11a, 11b at two sides thereof. To be more specific, part of the gate electrode is disposed in each of the isolation trenches 2 so as to extend along a side of each of the fin-like portions 11a, 11b. Moreover, the second gate electrode is disposed in the second gate groove 180. In the bottom portion of each of the isolation trenches 2, for example, a silicon nitride layer 25 may be disposed so as to simplify the manufacturing process of this specific embodiment.

For example, when addressing the gate electrode 181 of the transistor shown in FIG. 1A to 1D, the fin-like channel portions 11a and 11b may be fully depleted. As a consequence, a potential applied to the gate electrode 181 may immediately influence the charge density in each of the fin-like channel portions 11a, 11b. As a consequence, the transistor has an improved sub-threshold slope. Hence, an improved on-current/off-current-ratio is obtained. In addition, as can be seen from FIG. 1A, 1B and 1D the effective channel width is enlarged so that there is more current flowing.

FIGS. 1E and 1F show cross-sectional views of an exemplary transistor of the first type along different directions, respectively. As can be seen, the cross-sectional view shown in FIG. 1E shows a cross section along an active area 18 between Ia and Ia. The first gate electrode 171 is formed in a first gate groove 170. The gate groove 170 is formed in the surface 10 of the semiconductor substrate. A first and a second source/drain portion 23 and 24 are formed adjacent to the substrate surface 10. The channel 14 is formed between the first and the second source/drain portion 23, 24. A current path 15 of an electrical current flowing between the first and the second source/drain regions 23, 24 comprises a vertical component 15a, a horizontal component 15b as well as a vertical component 15c. The transistor of the first type may be formed as a so-called corner device. In this case, for example the first gate electrode 171 may further comprise plate like portions 175 which extend in a plane which lies before or behind the depicted plane of the drawing. This is illustrated in more detail in FIG. 1F showing a cross-sectional view between II and II of an exemplary implementation of the first transistor. As can be seen, the plate-like portions 175 extend in each of the isolation trenches 2. For example, the plate-like portions 175 may extend to a depth in the isolation trenches which is greater than the depth of the bottom portion of the first gate electrode 171 in the substrate portion. As a consequence, in the corner device, the channel 14 is enclosed at three sides by the gate electrode 171. Accordingly, due to the presence of the plate-like portions 175, the width w of the resulting transistor is enlarged. Moreover, since the first gate electrode is formed in a gate groove 170, the channel length is enlarged while maintaining the area needed for the transistor.

As a further modification, a portion of the first gate electrode may be disposed in the first isolation trenches. Moreover, the gate electrode 171 may extend in the isolation trenches 2 to the same depth as in the substrate portion.

An integrated circuit comprising the transistor of the first type as shown in FIGS. 1E and 1F, for example, and a transistor of a second type shown in any of FIG. 1A to 1D, respectively, is advantageous, because the threshold voltages of each of the transistors can be adjusted in accordance with the requirements of the system. Usually, transistors having a high threshold voltage can be advantageously used for low-power purposes and transistors having a low threshold voltage can be used for high-speed purposes. Accordingly, depending on the specific application, transistors having the desired threshold voltage can be combined on one single semiconductor chip.

Figure 1G:
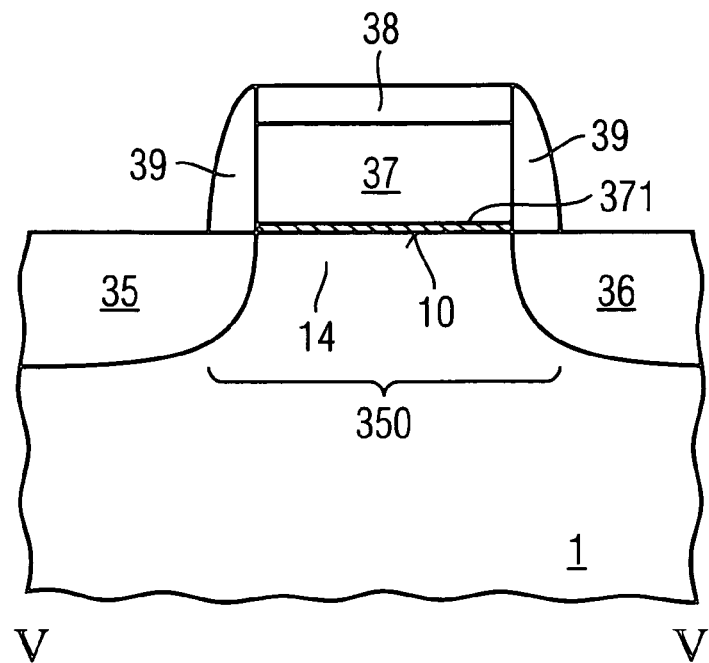
FIG. 1G shows a cross-sectional view of still another exemplary integrated circuit along the first direction.

According to an embodiment, the integrated circuit may further comprise a transistor of a third type which is implemented as a planar transistor. FIG. 1G shows a cross-sectional view of the transistor of the third type. As is shown in FIG. 1G, the transistor 350 of the third type comprises source/drain regions 35, 36 as well as a gate electrode 37. The gate electrode 37 is entirely disposed above the surface 10 of the semiconductor substrate 1. Accordingly, the channel 14 of this transistor is horizontal and extends along the substrate surface 10. As is common, the gate electrode 37 may be covered by a cap layer 38 and may further comprise spacers 39 which may be made of silicon nitride, for example. Since the transistor 350 shown in FIG. 1G is generally known, a detailed description thereof is omitted.

The integrated circuit or semiconductor chip described herein comprising transistors of the first and second types and, optionally, of the third type can be applied in logic products such as a CPU ("central processing unit"), in DSP chips ("digital signal processor") or a data processing system. For example, these products may be used in personal computers, notebooks, PDA's ("personal digital assistant") wherein low-power and high-speed are extremely important. Moreover, the integrated circuit may be implemented as a memory device comprising an array portion in which a plurality of memory cells are disposed and a peripheral portion comprising circuitry for addressing, writing and reading an information to and from the memory cells. For example, the transistor of the first type may be employed in the array portion and the transistor of the second type may be employed in the peripheral portion. Moreover, the integrated circuit according to an embodiment may be a semiconductor device, for example, an embedded DRAM device, comprising a memory portion in which memory cells including transistors of the first type are disposed. The semiconductor device may further comprise logical circuits including transistors of the second type. As is clearly to be understood, the scope of embodiments of the invention also comprises semiconductor wafers in which the integrated circuits as described above are formed.

In the following, an exemplary embodiment of the method of manufacturing an integrated circuit will be described.

Figure 15:
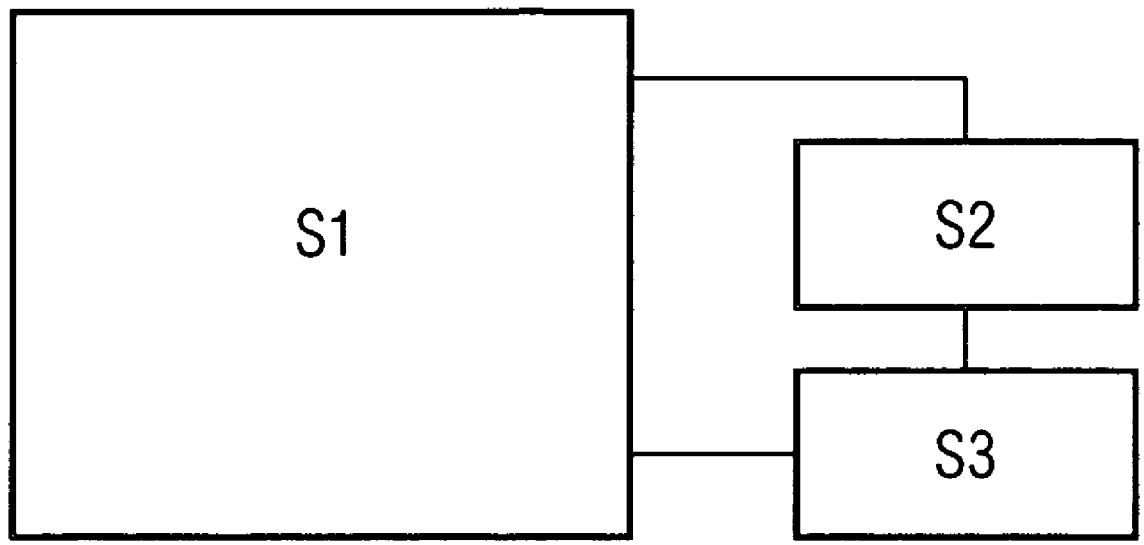
FIG. 15 schematically shows a method of manufacturing an integrated circuit according to an exemplary embodiment.

FIG. 15 shows a flow chart illustrating a method of manufacturing an integrated circuit according to an embodiment. As is shown, a method of manufacturing an integrated circuit comprises forming a transistor of a first type comprising a first gate electrode and forming a transistor of a second type comprising a second gate electrode wherein the first gate electrode is formed in a first gate groove that is defined in a semiconductor substrate and the second gate electrode is formed in a second gate groove defined in the semiconductor substrate, wherein the first gate electrode is formed so as to completely fill a space between two adjacent isolation trenches and the second gate electrode is formed so as to partially fill a space between two adjacent isolation trenches, substrate portions being arranged between the second gate electrode and the adjacent isolation trenches, respectively (S1). By way of example, the first gate groove and the second gate groove may be defined by common etching processes which simultaneously etch the first and the second gate grooves. For example, the first gate groove and the second gate groove may be defined by an etching process which removes a substrate material between adjacent isolation grooves, part of the substrate material remaining between the first gate grooves and the adjacent isolation trenches and between the second gate grooves and the adjacent isolation trenches, respectively (S2). The method may further comprise selectively etching the substrate material between the first gate groove and the adjacent isolation trenches while maintaining the substrate portions between the second gate groove and the adjacent isolation trenches (S3).

FIG. 2 shows exemplary plan views of a substrate which may be used when performing the method according to an embodiment of the present invention. As can be seen, active areas 18 are defined. For example, the active areas may be defined by defining isolation trenches 2 and filling the isolation trenches with an appropriate insulating material. Various components may be already formed in the semiconductor substrate. For example, isolation structures may be defined in each of the active area lines 18 so as to form single active area segments. By way of example, the isolation structure may be an isolation trench which is filled with an insulating material. As a further example, isolation field effect transistors may be formed so as to form active area segments. The isolation field effect transistor may be operated in an off-state so as to insulate neighboring active area segments, which are assigned to one active area line, from each other. As is clearly to be understood, the isolation structures or the isolation field effect transistors may as well be formed during the following process steps. As a further example, capacitor trenches may be formed, segmenting the active area lines 18. Nevertheless, since the specific implementation of the isolation structure can be performed in an arbitrary manner, the following specification will be focused on the formation of the transistors of the first and second types, respectively.

In the semiconductor substrate, various implants for defining the well portions may be performed. Moreover, the implantation steps for defining source and drain portions of the first and second transistor type may be performed. In the layout shown in FIG. 2A, the active area lines 18 and the isolation trenches 2 extend along the first direction 61. As is further shown in FIG. 2B, the active area lines 18 and the isolation trenches 2 may as well extend in a direction which is slanted with respect to the first and the second directions 61, 62.

On top of the substrate surface shown in FIG. 2A or 2B, for example, several hardmask layers are provided. By way of example, silicon nitride liner 44 having a thickness of 10 nm, a hard mask layer, for example, a carbon hard mask layer 41, having a thickness of 200 to 300 nm, and a silicon oxynitride layer 42, having a thickness of 40 to 60 nm are deposited. The specific composition of each of the layers is only given by way of example and may be selected in accordance with the requirements of the specific process employed.

Figure 3A:
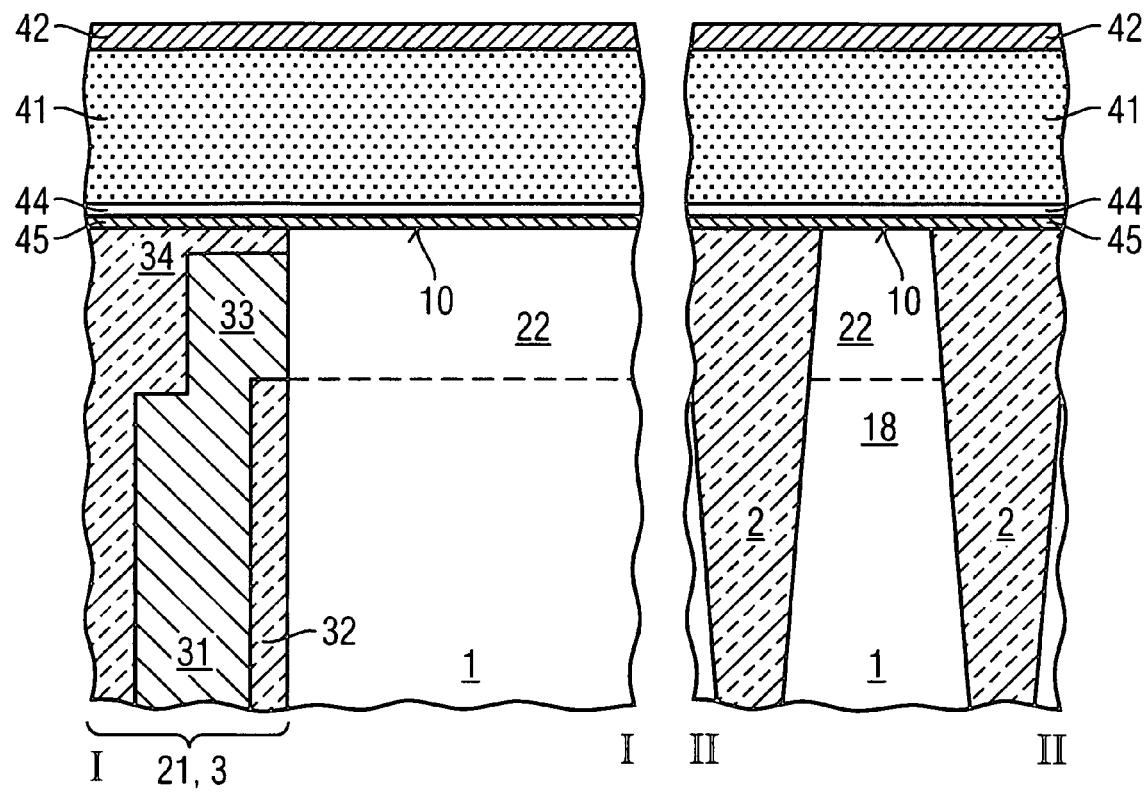
Figure 3B:
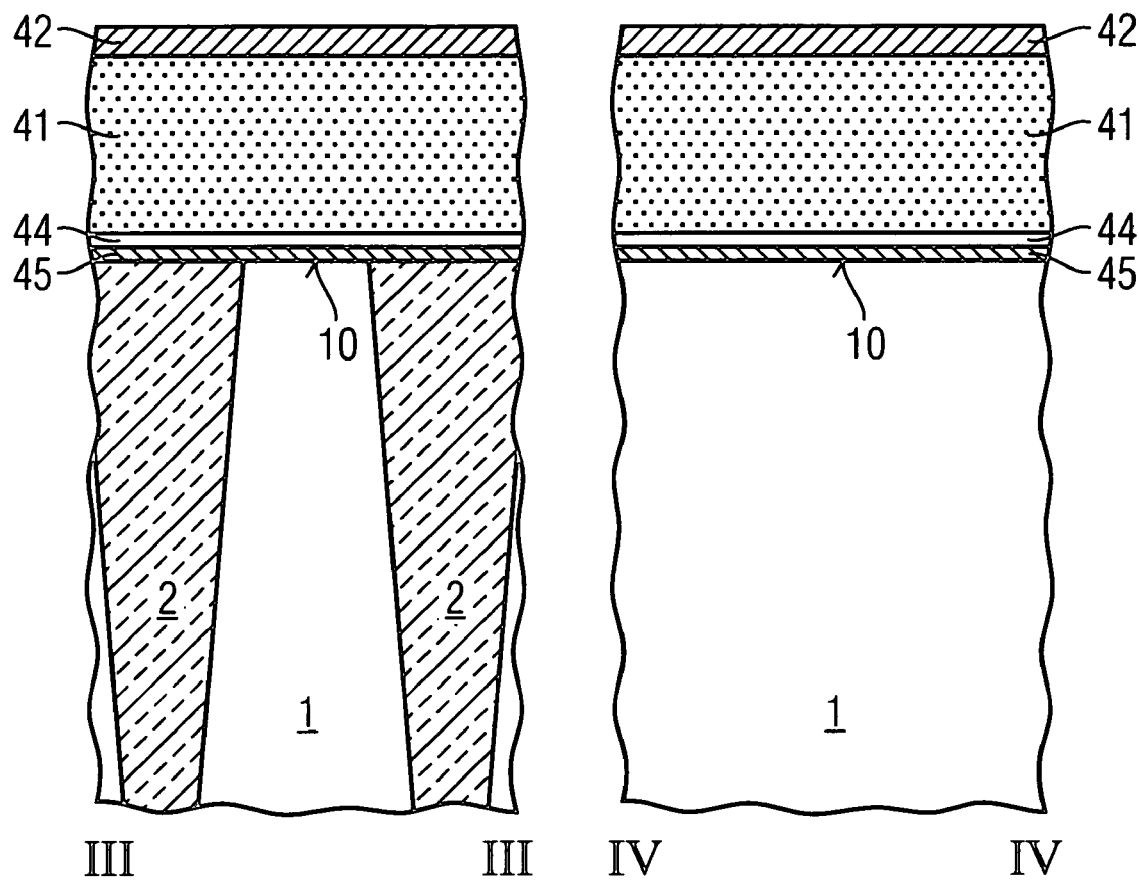

FIG. 3 shows cross-sectional views of the resulting structure. In particular, FIG. 3A shows cross-sectional views of a substrate portion in which the transistor of the first type is to be formed, whereas FIG. 3B shows cross-sectional views of the substrate portion in which the transistor of the second type is to be formed. By way of example, if the semiconductor chip is implemented as a memory device, the cross-sectional views between I and I and between II and II may be taken in the array portion, whereas the cross-sectional views shown between III and III and between IV and IV are taken in the peripheral portion. Nevertheless, as is clearly to be understood, they may as well be taken at different portions of any semiconductor chip. In the following cross-sectional views, the cross-sectional view between I and I is taken along an active area line 18, whereas the cross-sectional view between II and II is taken perpendicularly with respect to the direction in which the active area lines 18 extend. For example, in the layout shown in FIG. 2A, the cross-sectional view between II and II is taken along the second direction 62. Moreover, in a similar manner, the cross-sectional view between III and III is taken perpendicularly with respect to the direction of the active area lines 18, whereas the cross-sectional between IV and IV is taken along the direction of the active area lines 18. By way of example, in the layout shown in FIG. 2A, the cross-sectional view between III and III is taken along the second direction 62.

As is shown in FIG. 3A, a doped portion 22 is formed adjacent to the substrate surface. Moreover, a pad oxide layer 45, a silicon nitride layer 44, a carbon hard mask layer 41 as well as a silicon oxynitride layer 42 are stacked on top of the surface 10 of the semiconductor substrate 1. As is shown in the left-hand portion of the cross-sectional view between I and I an isolation device, for example, a trench capacitor 3 may be disposed in the substrate so as to isolate active area segments. As is shown in the cross-sectional view between II and II, the isolation trenches 2 extend so as to define an active area 18 there between.

Moreover, FIG. 3B shows the cross-sectional views of the transistor of the second type. As can be seen, on top of the substrate surface 10, a pad oxide layer 45 is deposited, followed by a silicon nitride layer 44, a carbon hardmask layer 41 and a silicon oxynitride layer 42. In the shown embodiment, a doped portion is not formed in the substrate portion in which the transistor of the second type is to be formed. As has been explained above, nevertheless, this substrate portion may be already doped.

Referring to FIGS. 4A and 4B, thereafter, hardmask openings 43 are defined in the hard mask layer stack. For example, this may be accomplished by a photolithographic process in which a photoresist material is applied to the surface of the material to be patterned. An exposure step is performed using an appropriate photomask. The upper portion of FIG. 4A shows an exemplary plan view of the substrate including a photoresist layer 47 which is patterned using a photomask having mask openings 48 at predetermined positions. The mask openings 48 may have any arbitrary shapes, for example, an elongated shape as indicated in the upper portion of FIG. 4A which may be oval or approximately rectangular shaped. Nevertheless, the mask openings 48 are positioned so as to open predetermined positions above the active areas 18. After photolithographically patterning the resist material 47, the hard mask layers are etched so as to define first hard mask openings 43. The etching is performed so as to stop on the substrate surface 10. As is shown in FIG. 4A, in the cross-sectional view between I and I the diameter of the first hard mask opening 43 is smaller than in the cross-sectional view between II and II. As can further be seen from FIG. 4A, the isolation trenches 2 are tapered with respect to the substrate surface. For example, an angle β between the normal 13 to the substrate surface 10 and the sidewall of the isolation trenches 2 may be 15° to 20°, although the invention is not limited to angles in this range.

Figure 4C:
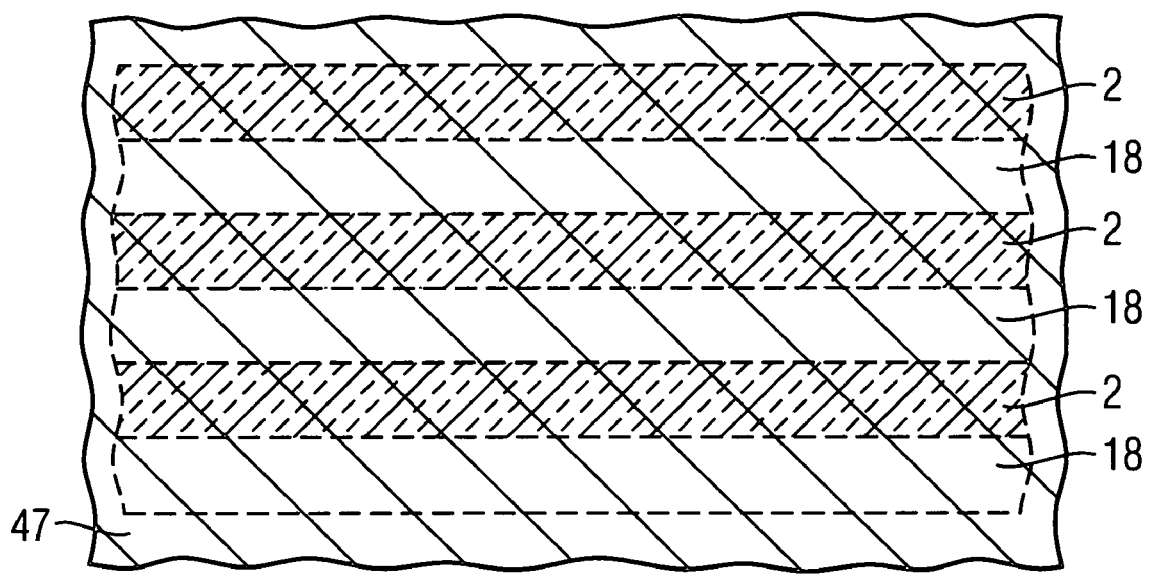

FIG. 4B shows cross-sectional views of a substrate portion in which the transistor of the second type is to be formed. In the upper portion of FIG. 4B an exemplary plan view of this substrate portion including a photoresist layer 47 which is to be patterned is shown. As can be seen, although one photomask is taken for simultaneously patterning the substrate portion shown in FIG. 4A and shown in FIG. 4B, the mask openings 48 for patterning the transistor of the second type are different from the mask openings 48 for patterning the first type. To be more specific, for example, a diameter of the mask openings 48 along the direction of the active areas is larger between IV and IV than between I and I. The etching is performed so as to stop on the surface 10 of the semiconductor substrate 1. FIG. 4C shows a plan view on a substrate portion in which optionally the transistor of the third type may be formed. The cross-sectional views of this substrate portion may be similar to the cross-sectional views shown in FIGS. 3A and 3B, respectively. As is shown in FIG. 4C, the hardmask is not opened above this substrate portion.

Figure 5A:
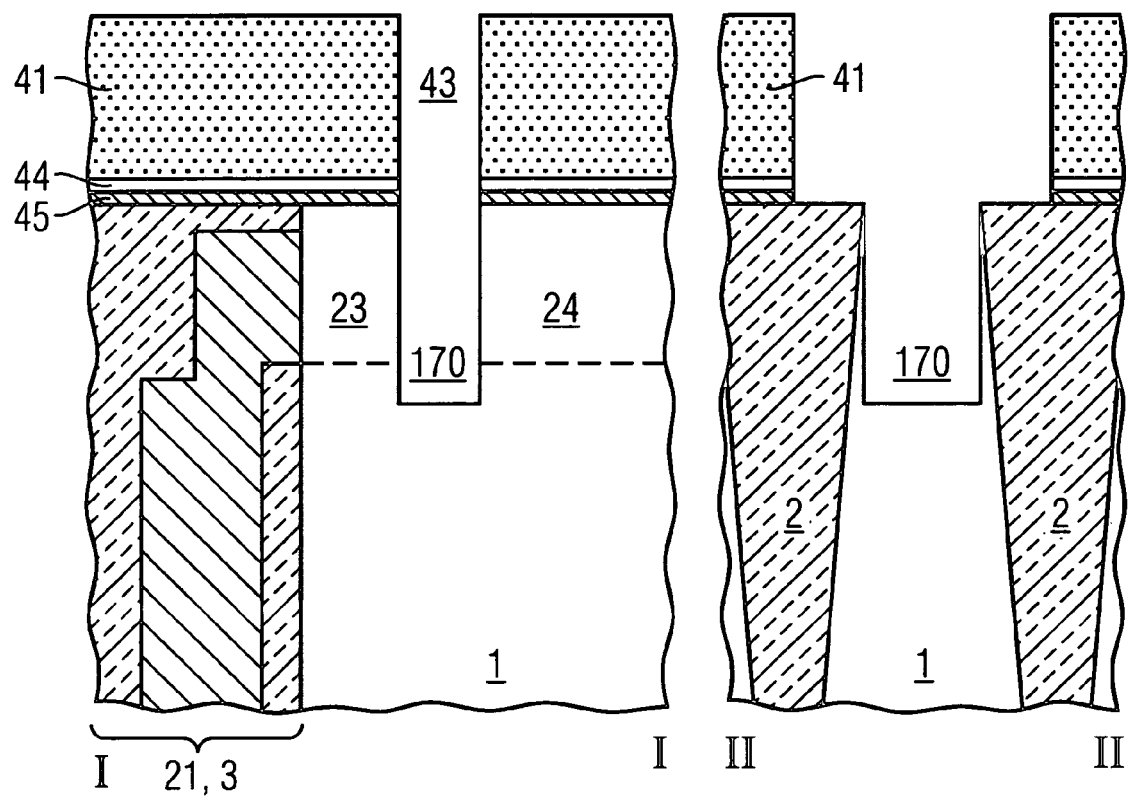

Referring to FIGS. 5A and 5B, thereafter, the substrate material is etched taken the patterned hard mask as an etching mask. For example, this etching may be performed as an anisotropic etching. As can be seen in FIG. 5A, a first gate groove 170 is formed in the substrate 1. For example, the first gate groove 170 may extend to a depth of approximately more than 60 nm, for example, more than 100 nm and even more than 150 nm. As can be seen from the cross-sectional view between I and I, now, the doped portions 22 is isolated in a first and a second source/drain portions 23, 24. In the cross-sectional view between II and II, the gate groove 170 extends in the substrate, leaving a substrate portion left between the gate groove 170 and the isolation trenches 2. As is further shown in FIG. 5A, the first gate groove 170 extends to a greater depth than the bottom portion of the first and second source/drain portions 23, 24.

As can be seen from FIG. 5B, a second gate groove 180 is defined between III and III and between IV and IV, respectively. In the cross-sectional view between III and III, a substrate portion 1 is left between the second gate groove 180 and the isolation trenches 2. In the next step, the remaining portions of the hard mask material are stripped from the substrate surface. The resulting structure is shown in FIGS. 6A and 6B.

Figure 6A:
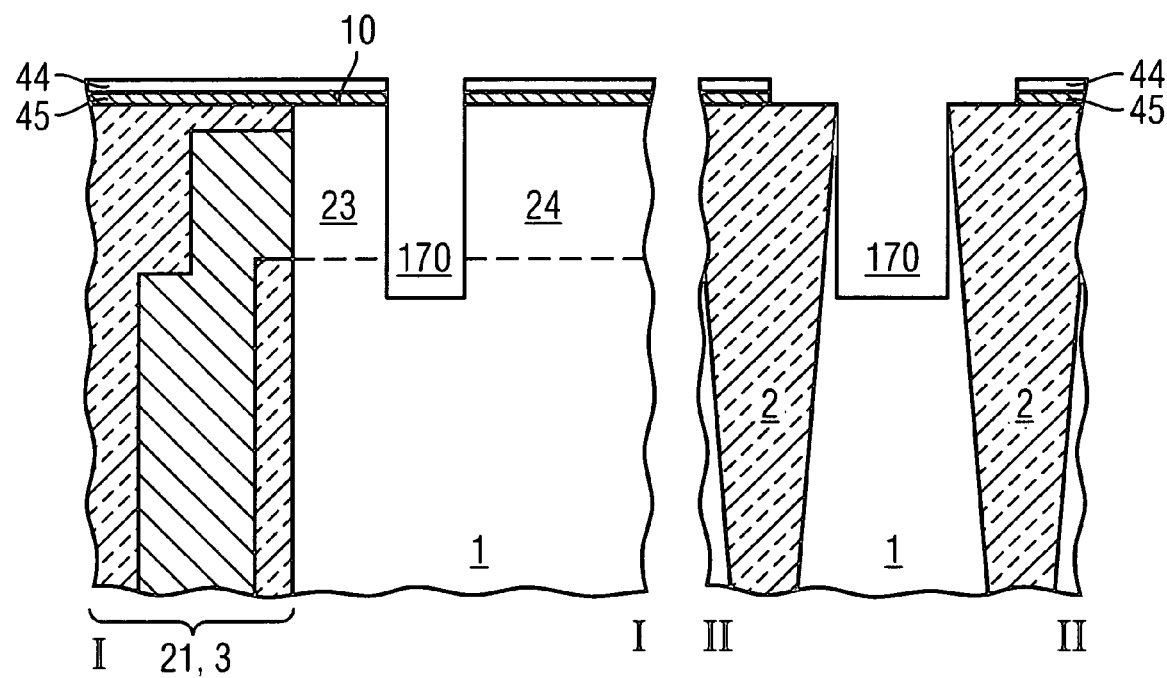

As can be seen from FIGS. 6A and 6B, now the remaining portions of the hard mask material are removed from the surface, leaving the silicon nitride layer 44 as the top mask layer. Thereafter, a block mask is applied on the surface and patterned so as to cover the substrate portion in which the transistor of the second type is to be formed. As a result, the substrate surface, in which the transistor of the first type is to be formed is left uncovered. Then, an isotropic etching step for etching the substrate material is performed. For example, this etching may be selective with respect to silicon nitride and silicon oxide. For example, this etching may be performed so as to etch approximately 10 to 100 nm, for example, 10 to 50 nm. As can be taken from FIG. 7A, showing the substrate portion in which the transistor of the first type is to be formed, the remaining substrate portions between the first gate groove 170 and the isolation trenches 2 now are removed. Accordingly, the first gate groove 170 completely fills the space between the adjacent isolation trenches in the upper portion thereof. Moreover, in the cross-sectional view between I and I, the first gate groove 170 has a shape having rounded corners. Optionally, at this processing step, a further isotropic etching step for etching silicon oxide may be performed so as to form a corner-device. By this isotropic etching plate-like portions of the gate electrode are defined which extend in the isolation trenches 2. A cross-sectional view after this optional processing step is indicated by broken lines in FIG. 7A.

Figure 7B:
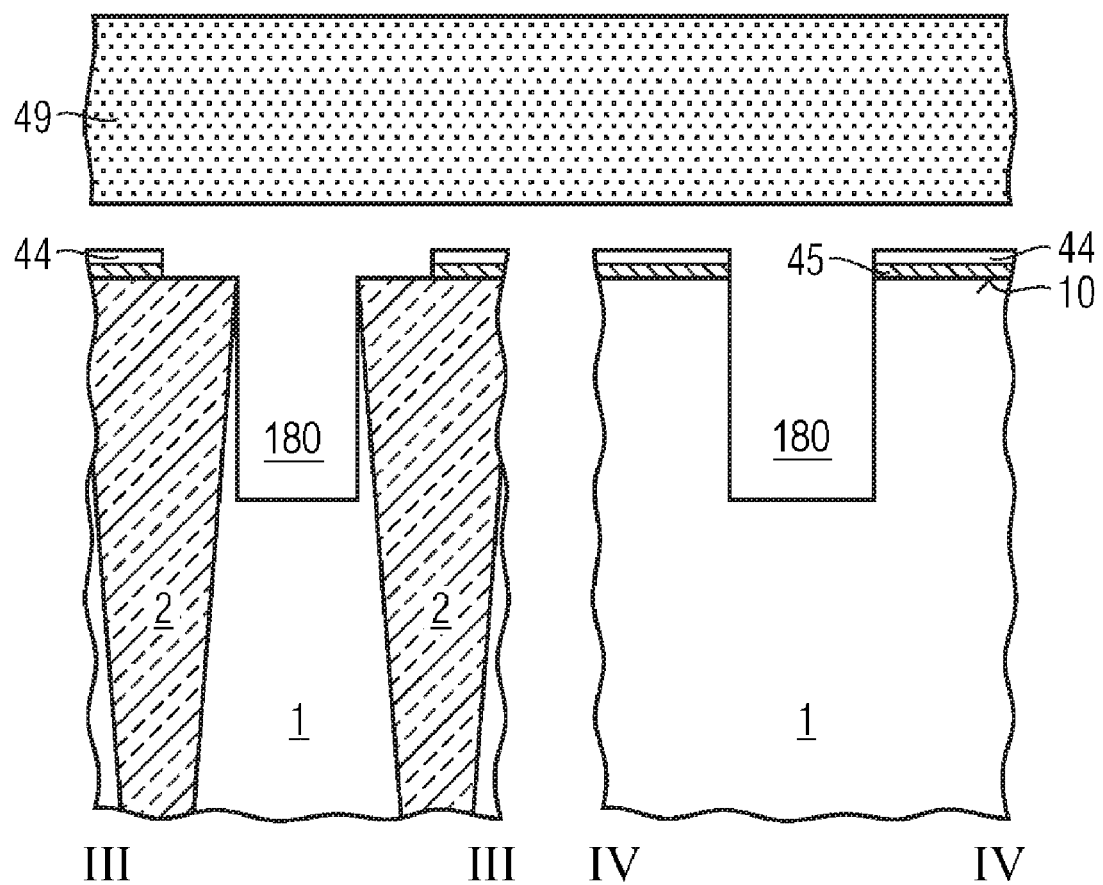

FIG. 7B shows the substrate portion in which the transistor of the second type is to be formed, this substrate portion being covered by a block mask. Since this substrate portion has been covered by a block mask, the substrate portions remain between the second gate groove 180 and the isolation trenches 2. Thereafter, optionally implantation steps may be performed so as to enhance the oxidation rate on the vertical sidewalls of the gate groove 170. FIG. 8 shows schematically the angled ion implantation 63 for implanting the sidewalls. Thereafter, the block mask is removed from the substrate surface. Moreover, the silicon nitride liner 44 is removed. Optionally, a sacrificial oxide may be formed on the resulting surface, followed by a step of removing the sacrificial oxide layer. Thereafter, an oxidation step is performed so as to form the gate oxide on the uncovered substrate material.

The resulting structure is shown in FIGS. 9A and 9B. As can be seen from FIG. 9A, now, the sidewalls of the gate grooves are covered by a thick silicon oxide spacer 174. Moreover, a silicon oxide layer 172 is formed on the bottom portion of the gate groove 170. Due to the ion implantation step, the thickness of the silicon oxide layer 174 which covers the sidewall of the gate groove 170 is increased.

FIG. 9B shows cross-sectional view of the substrate portion in which the transistor of the second type is to be formed. As can be seen, a silicon dioxide layer 182 is formed on the surface of the second gate groove 180. Thereafter, the materials constituting the gate electrode are deposited. By way of example, a polysilicon layer 64 may be deposited, followed a tungsten layer 65 and a silicon nitride layer 66. For example, the polysilicon layer may have a thickness of at least 30 nm. By way of example the thickness of the polysilicon layer 64 may be less than 100 nm. Moreover, the thickness of the tungsten layer 65 may be more than 30 nm. By way of example, the thickness of the tungsten layer 65 may be less than 100 nm. In addition, the silicon nitride layer 66 may have a thickness larger than 50 nm. For example, the thickness of the silicon nitride layer 66 may be less than 250 nm. Nevertheless, also other materials for constituting the gate electrode may be employed, for example, a tungsten silicide layer having a thickness of more than 30 nm and, for example, less than 150 nm and a silicon nitride layer having a thickness of more than 50 nm and, for example, less than 250 nm.

Figure 10A:
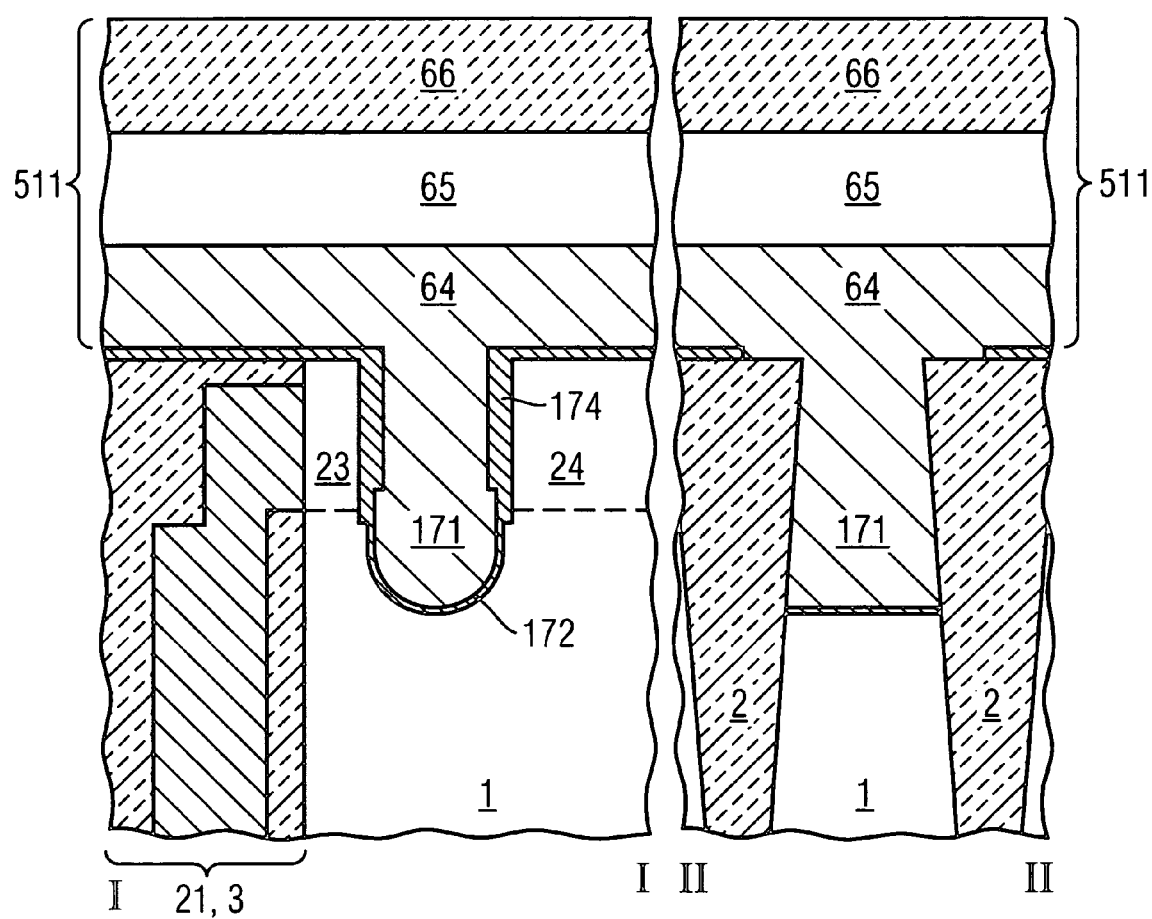
Figure 10B:
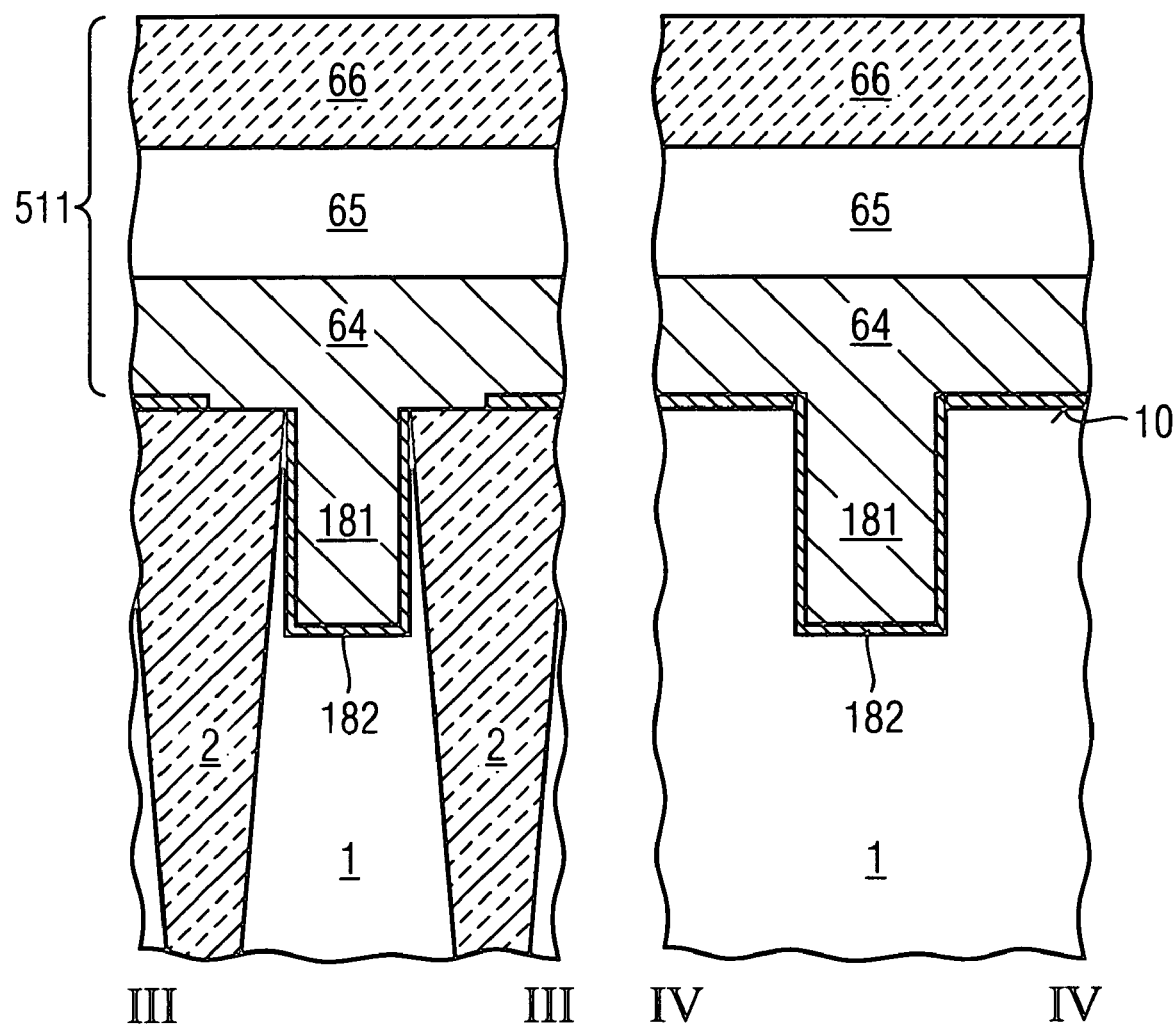
Figure 10C:
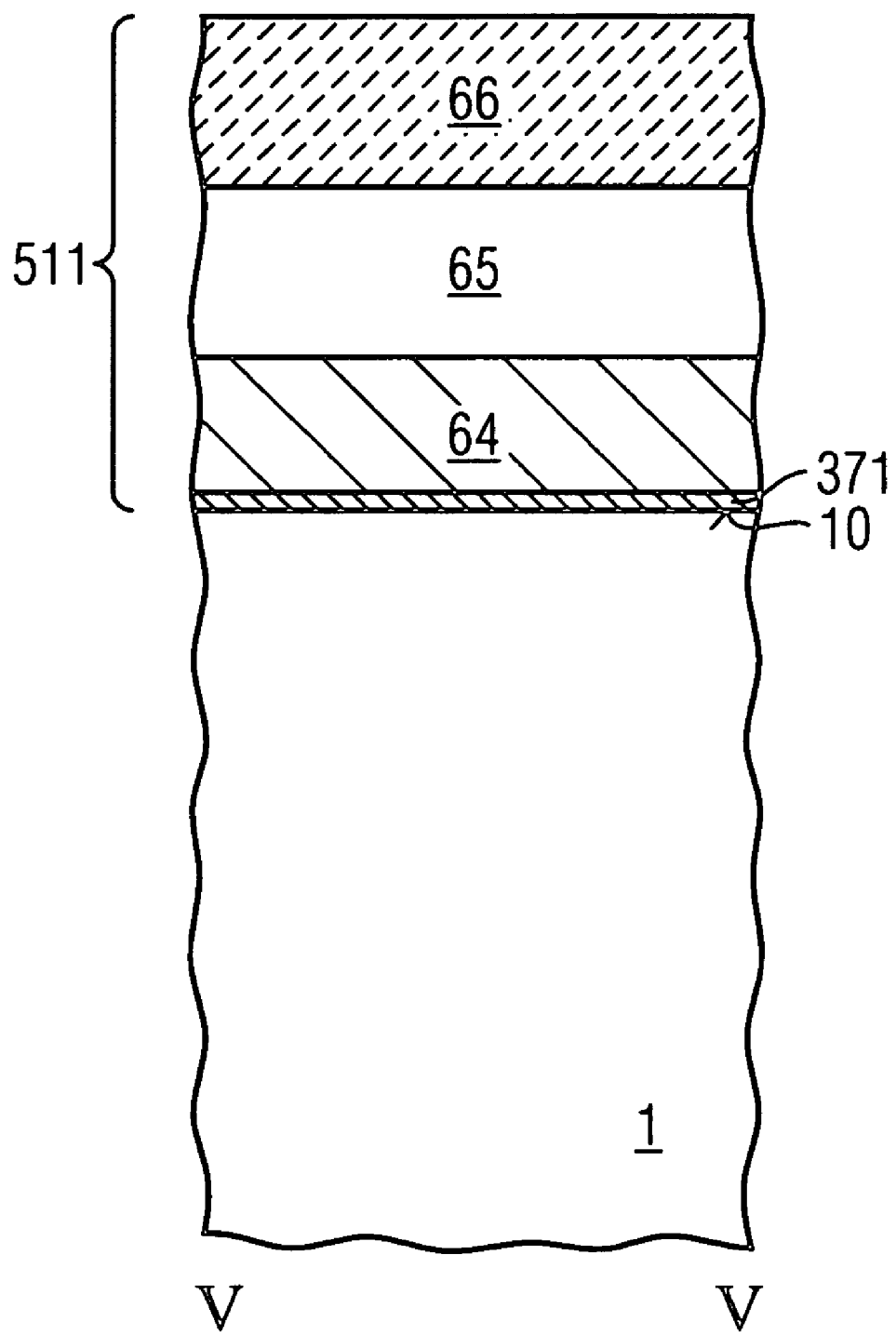

The resulting structure is shown in FIGS. 10A-10C. As can be seen, the polysilicon material 64 entirely fills the first gate groove 170 and the second gate groove 180. Accordingly, a first gate electrode 171 is formed as is shown in FIG. 10A. As is shown in FIG. 10B, also a second gate electrode 181 of the same material is formed in the portion in which the transistor of the second type is to be formed. Moreover, FIG. 10C shows a substrate portion, in which the transistor of the third type is to be formed. The layer stack 511 for forming a gate electrode is formed over the substrate surface 10. Thereafter, patterning steps are performed so as to pattern the wordline layer stack 511. After patterning the wordlines in the substrate portion in which the transistor of the second type is to be formed, optionally, an ion implantation step may be performed for defining the source and drain regions of the transistor of the second type and, optionally, of the transistor of the third type. The second source/drain regions 26, 27 may be implanted so as to provide a junction which is more shallow than the junction of the transistor of the first type. To be more specific, for example, the second source/drain regions may extend to a smaller depth than the source/drain regions of the first transistor. The resulting structure is shown in FIGS. 11A-C.

Figure 11A:
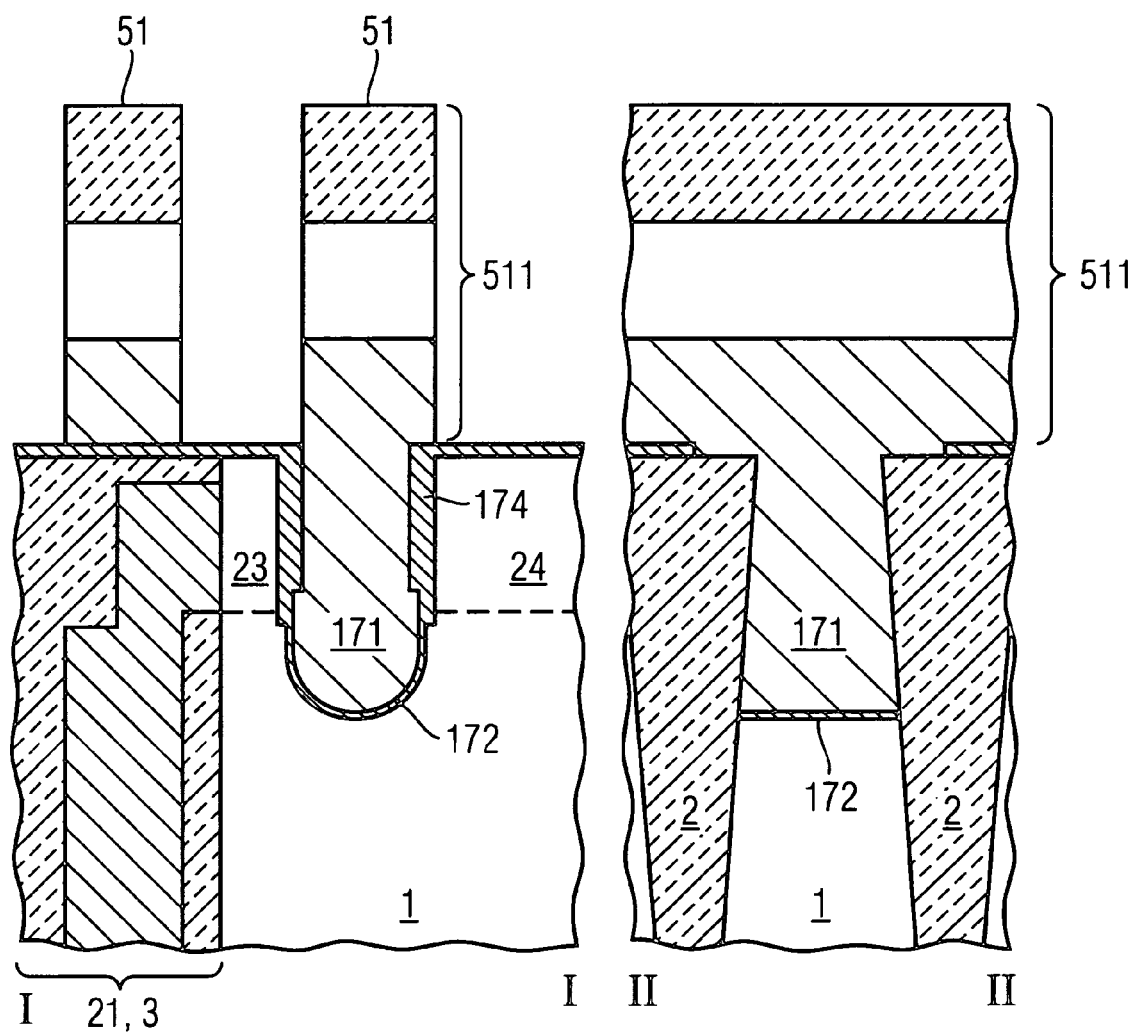
Figure 11B:
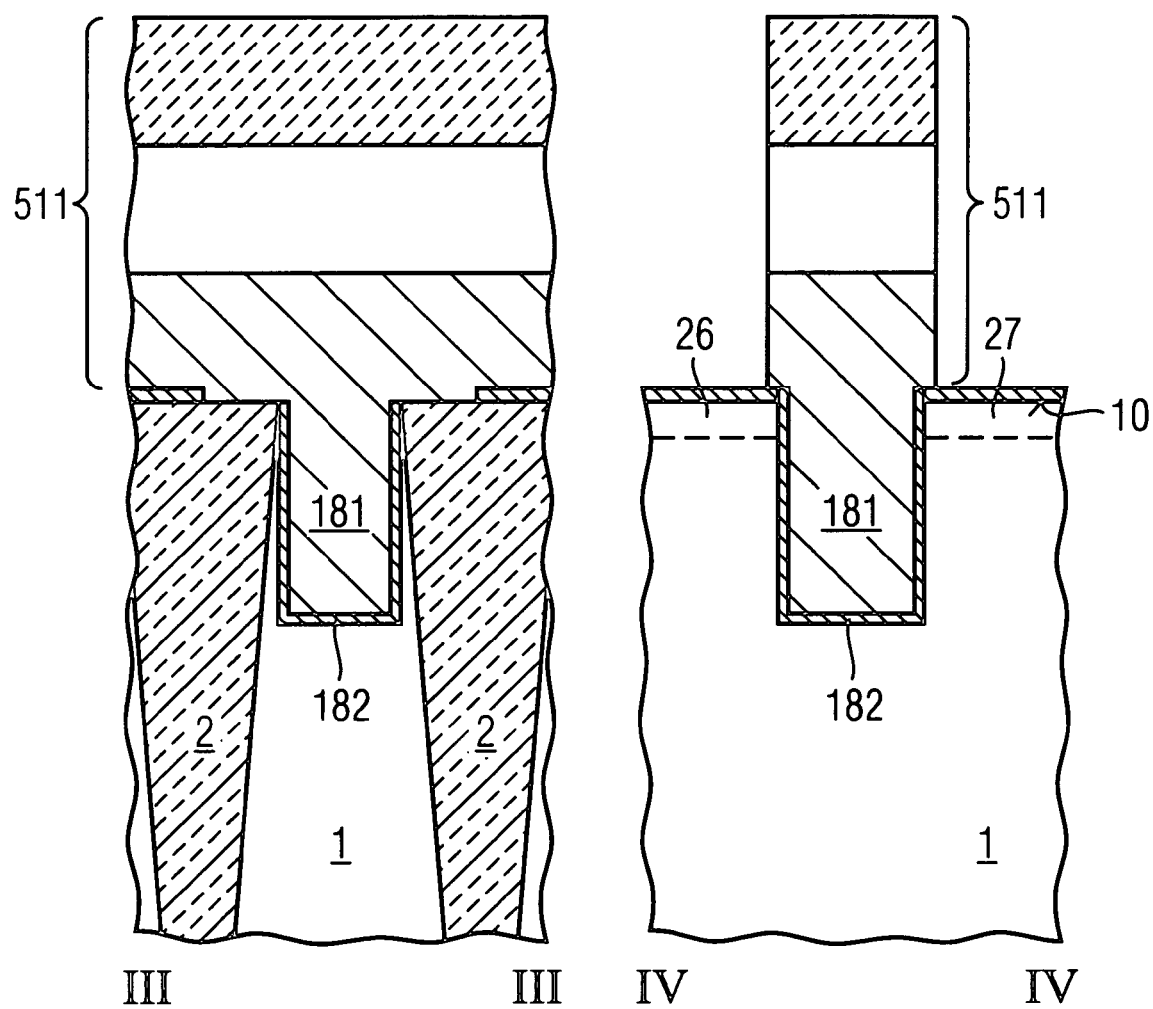
Figure 11C:
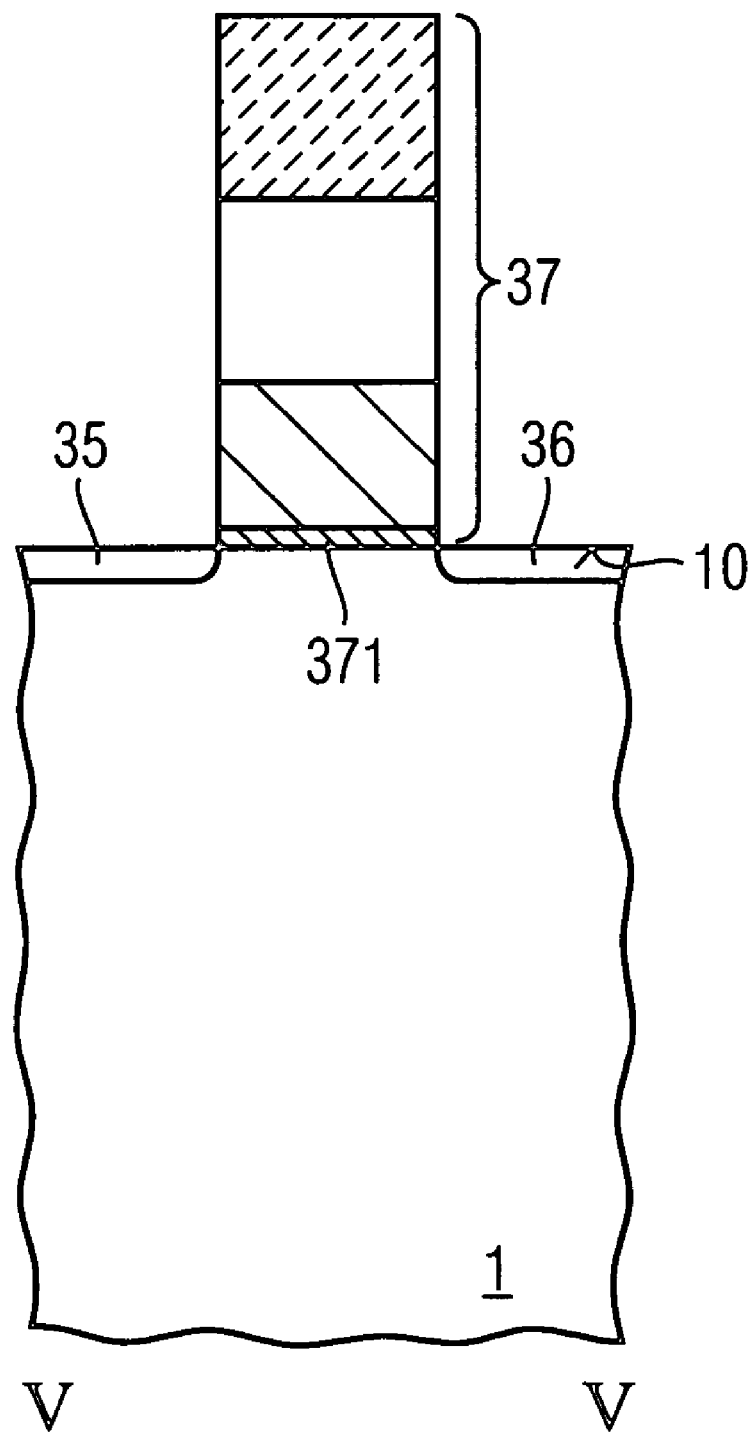

As can be seen from FIGS. 11A and 11B, the wordlines extend so as to intersect the active areas. FIG. 11C shows a cross-sectional view of the transistor of the third type wherein the wordline is patterned and the first and second source/drain regions 35, 36 are defined. Moreover, the wordlines extend in a direction shown between II and II and between III and III, respectively. Thereafter, as is common, contacts for contacting the second source/drain region 23 as well as for contacting a doped portion of the transistor of the second type are performed.

Figure 12A:
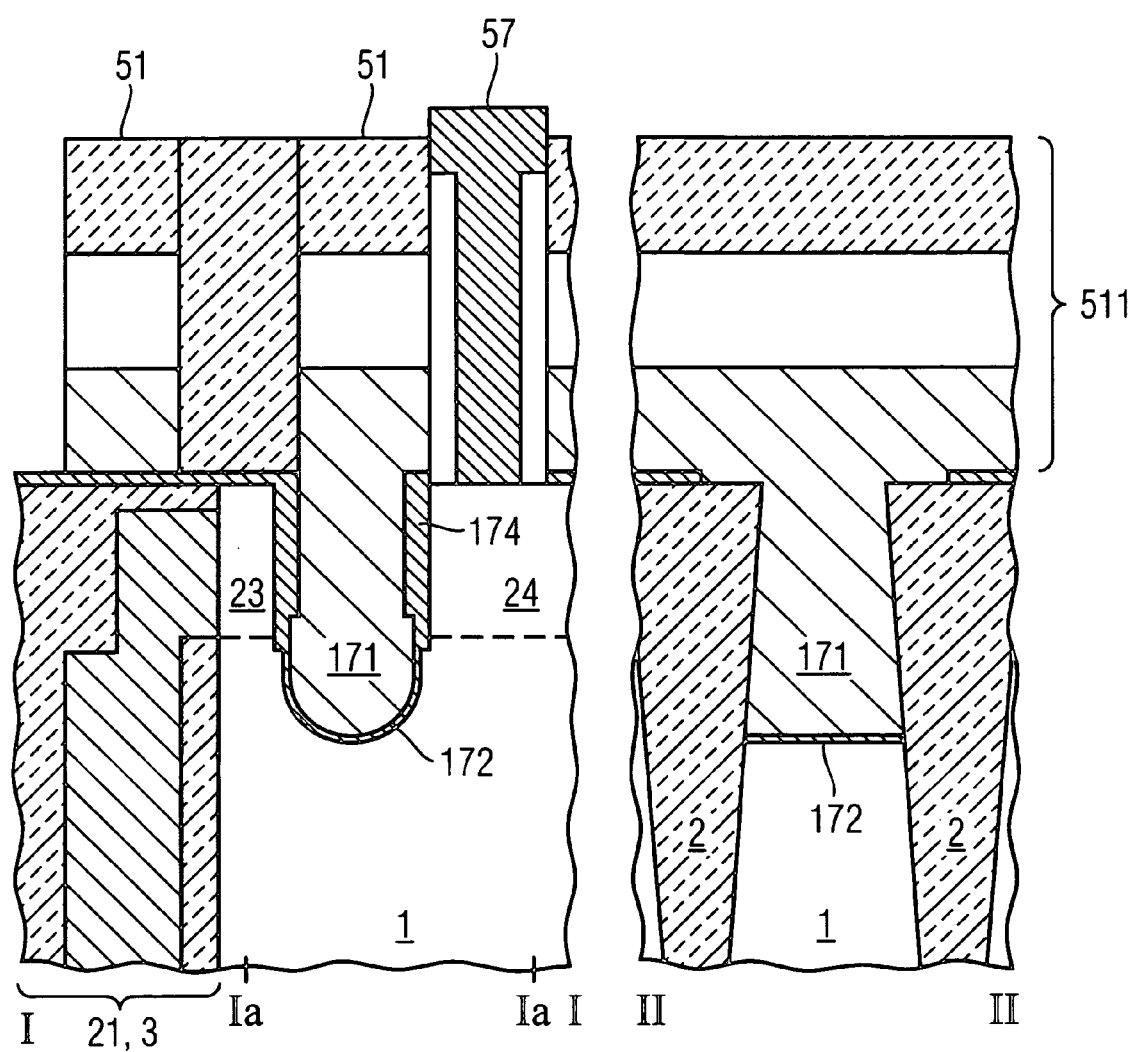
FIG. 12A shows cross-sectional views along a first and a second direction, respectively, at a first position of an integrated circuit according to an embodiment of the invention.
Figure 12B:
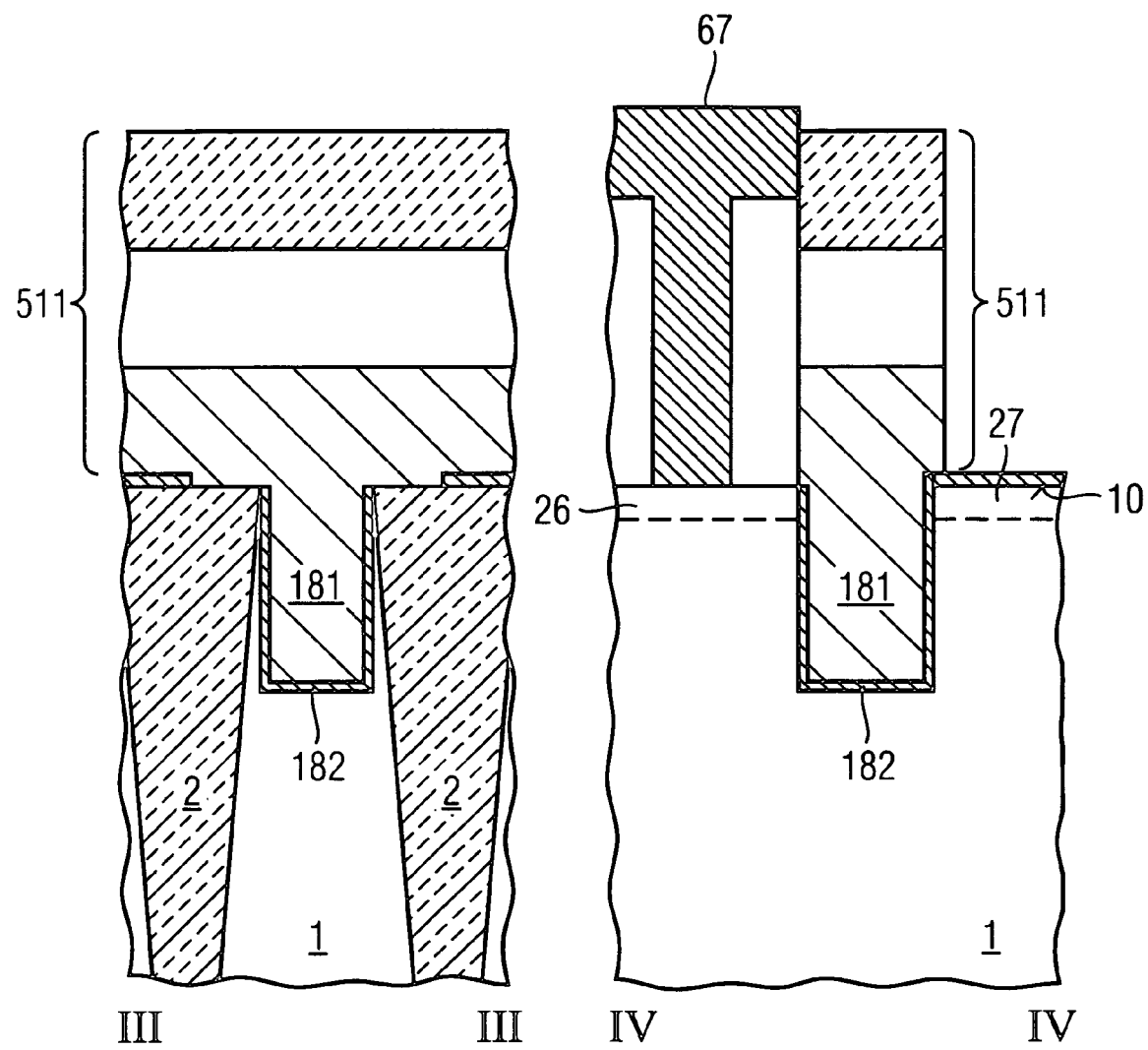
FIG. 12B shows another cross-sectional view of an integrated circuit at another position according to an embodiment of the invention.

FIGS. 12A and 12B show cross-sectional views of the transistors after providing the contacts. As is shown in FIG. 12A, the bitline contact 57 is provided adjacent to the second source/drain portion 24 of the transistor of the first type. Moreover, as can be seen from FIG. 12B, a contact 67 is provided so as to be adjacent to a corresponding source/drain portion 26 of the transistor of second type.

Figure 13:
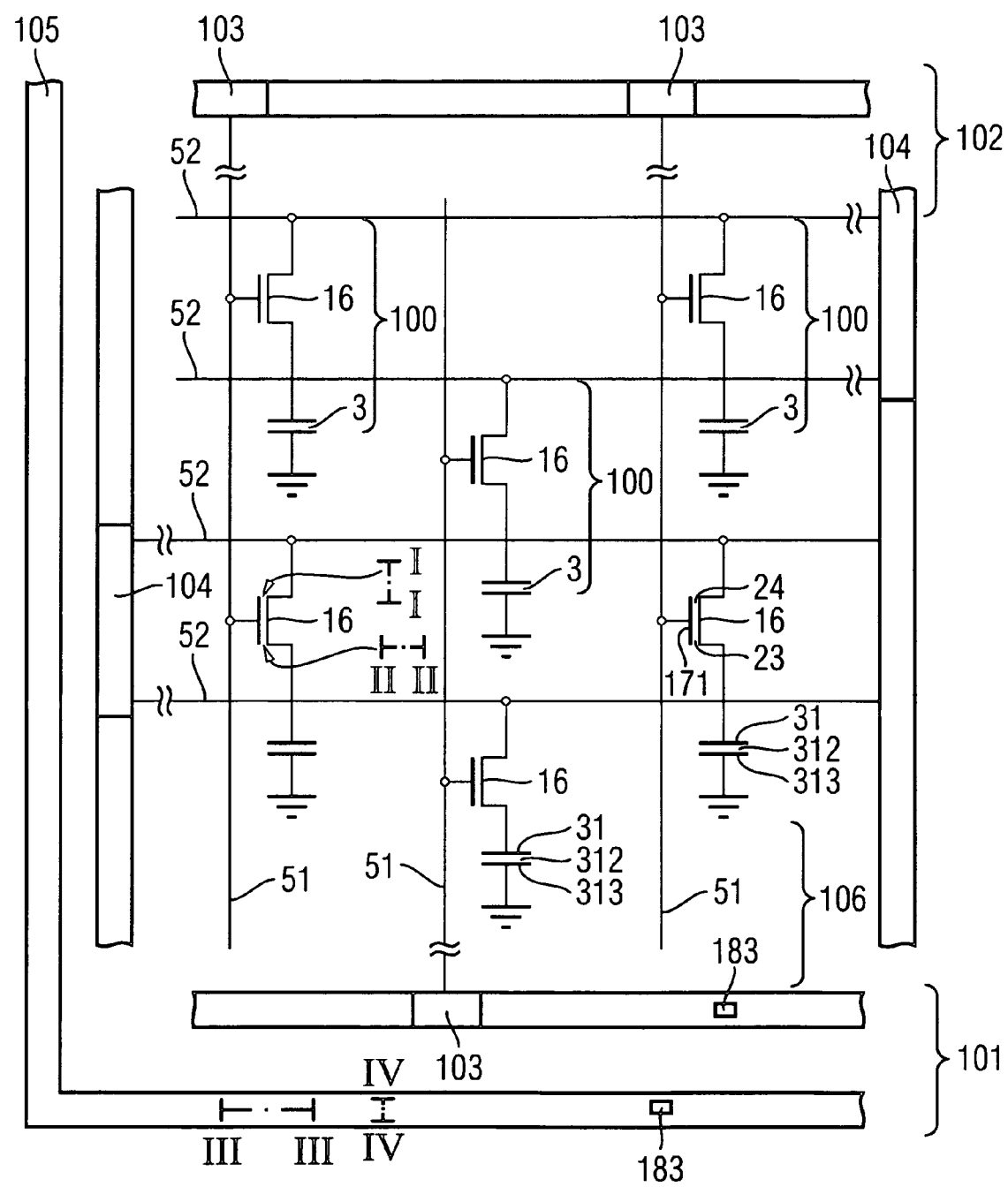
FIG. 13 shows a schematic plan view of a memory device which may embody the integrated circuit according to an embodiment of the invention.

FIG. 13 shows a plan view of an exemplary memory device, which may comprise the transistors which have been described above. For example, the memory device shown in FIG. 13 comprises an array portion 106, in which memory cells 100 are disposed and a peripheral portion 101. The peripheral portion 101 may comprise the core circuitry 102 and the support portion 105. For example, wordline drivers 103 may be disposed in the core circuitry. Moreover, the core circuitry may comprise sense amplifiers 104 for sensing the received signals. As is common, the peripheral portion and the memory cell array may be formed on one single semiconductor chip. Each of the memory cells 100 may comprise a storage element such as a storage capacitor 3 and a transistor 16. The memory cell array may comprise wordlines 51 which are connected with the gate electrodes 171 of the corresponding transistors 16. The wordlines 51 may be driven by the wordline drivers 103. Moreover, the second source/drain portions 23 of the transistors 16 may be connected with corresponding bitlines 52, the bitlines 52 being connected with sense amplifiers 104. For example, the access transistors of the individual memory cells 100 may be implemented as the transistor 16 of the first type. Moreover, the transistors, present in the peripheral portion 101 may be implemented as transistors 183 of the second type. For example, the cross-sectional view between III and III as well as between IV and IV may be taken in the peripheral portion 101, as is illustrated in FIG. 13, and the cross-sectional view between I and I and between II and II may be taken in the memory cell array portion 106.

Figure 14A:
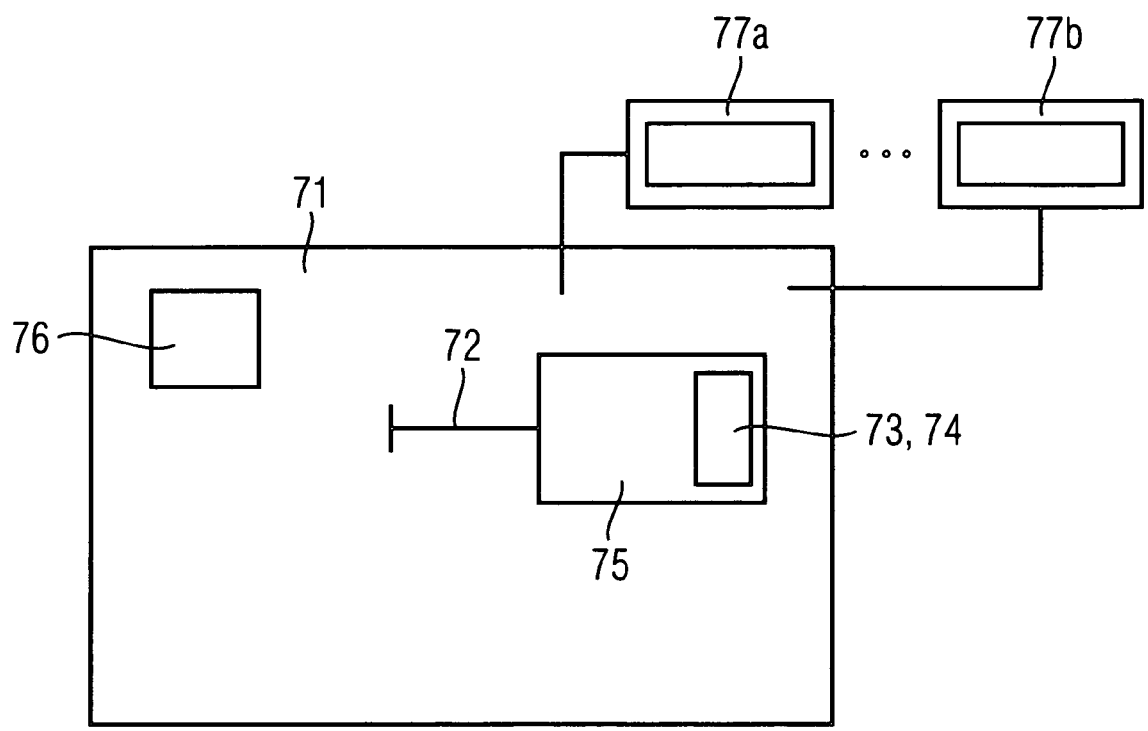
FIG. 14A shows an exemplary electronic device or system which may comprise an integrated circuit according to an embodiment.

FIG. 14A schematically shows an electronic device 71 according to an embodiment. As is shown in FIG. 14A, the electronic device 71 may comprise an interface 72 and a component 75 which is adapted to be interfaced by the interface 72. The electronic device 71, for example, the component 75 may include an integrated circuit 74 or a semiconductor chip 73 as has been explained above. The component 75 may be connected in arbitrary manner with the interface 72. For example, the component 75 may be externally placed so as to be connected with the interface 72. Moreover, the component 75 may be housed inside the electronic device 71 and may be connected with the interface 72. By way of example, it is also possible that the component 75 is removably placed into a slot which is connected with the interface 72. When the component 75 is inserted into the slot the semiconductor chip 73 or integrated circuit 74 is interfaced by the interface 72. The electronic device 71 may further comprise a processing device 76 for processing data. In addition, the electronic device 71 may further comprise one or more display devices 77a, b for displaying data. The electronic device may further comprise components which are adapted to implement a specific electronic system. Examples of the electronic system comprise a computer, for example, a personal computer or a note book, a server, a router, a game console, for example a video game console, as a further example, a portable video game console, a graphics card, a personal digital assistant, a digital camera, a cell phone, an audio system such as any kind of music player or a video system.

Figure 14B:
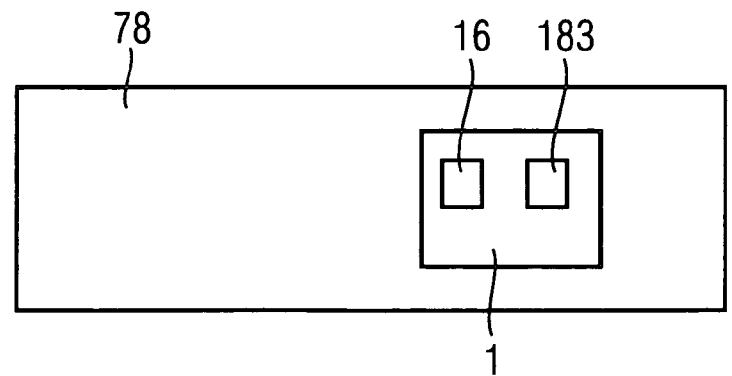
FIG. 14B shows an exemplary data processing system which may comprise an integrated circuit according to an embodiment.

Moreover, FIG. 14B shows a data processing system 78 comprising a transistor of a first type 16 and a transistor of a second type 183 which are disposed in a same semiconductor substrate 1, as has been explained above. By way of example, the data processing system may be a digital signal processing chip.

Nevertheless, as will be apparent to those skilled in the art, the electronic system may be exemplified by any other kind of device in which digital data are processed or transmitted or stored.

Having described exemplary embodiments of the invention, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A method of manufacturing an integrated circuit, comprising:
    forming a transistor of a first type comprising a first gate electrode formed in a first gate groove that is defined in a semiconductor substrate between first and second source/drain regions of the transistor of the first type, the first gate electrode completely filling a space between two adjacent first isolation trenches in a cross section along the first gate electrode perpendicular to a first direction defined by a line extending between the first and second source/drain regions; and
    forming a transistor of a second type comprising a second gate electrode formed in a second gate groove defined in the semiconductor substrate, the second gate electrode partially filling a space between two adjacent second isolation trenches in a cross section along the second gate electrode perpendicular to the first direction, wherein portions of the semiconductor substrate are arranged between the second gate electrode and the adjacent second isolation trenches on both sides of the second gate electrode in the cross section along the second gate electrode perpendicular to the first direction.

2. The method of claim 1, wherein the first gate groove and the second gate groove are defined by common etching processes.

3. The method of claim 2, wherein the first gate groove and the second gate groove are defined by an etching process which removes a substrate material between adjacent isolation grooves and leaves substrate portions between the first gate groove and the adjacent first isolation trenches and between the second gate groove and the adjacent second isolation trenches.

4. The method of claim 3, further comprising
    selectively etching the substrate material between the first gate groove and the adjacent first isolation trenches, wherein the substrate portions between the second gate groove and the adjacent second isolation trenches remain.

5. The method of claim 1, further comprising:
    etching a portion in the isolation trenches adjacent to the first gate groove so as to define plate-like portions of the first gate electrode.

6. The method of claim 1, further comprising:
    forming a planar transistor above the semiconductor substrate, the planar transistor comprising a third gate electrode.

7. The method of claim 1, wherein the transistor of the first type is a corner device.

8. The method of claim 1, wherein an angle $\beta$ between a normal to the substrate surface and a sidewall of at least one of the first and the second isolation trenches is greater than 15°.

9. The method of claim 1, wherein a portion of the second gate electrode is formed in the adjacent second isolation trenches.

10. The method of claim 1, wherein the substrate portions have a surface disposed more than 10 nm below a surface of the semiconductor substrate.

11. The method of claim 1, wherein the transistor of the first type is formed in a memory array portion of the semiconductor substrate and the transistor of the second type is formed in a peripheral portion of the semiconductor substrate, separate from the memory array.

12. The method of claim 1, wherein the transistor of the first type is formed with a different threshold voltage than a threshold voltage of the transistor of the second type.

* * * * *